United States Patent [19]

Sakaguchi et al.

[11] Patent Number: 5,492,859

[45] Date of Patent: Feb. 20, 1996

[54] METHOD FOR PRODUCING SEMICONDUCTOR DEVICE SUBSTRATE BY BONDING A POROUS LAYER AND AN AMORPHOUS LAYER

[76] Inventors: Kiyofumi Sakaguchi; Takao Yonehara; Shoji Nishida, all of c/o Canon Kabushiki Kaisha 30-2, 3-chome, Shimomaruko, Ohta-ku, Tokyo, Japan

[21] Appl. No.: 369,325

[22] Filed: Jan. 6, 1995

Related U.S. Application Data

[63] Continuation of Ser. No. 284,265, Aug. 2, 1994, abandoned, which is a continuation of Ser. No. 10,627, Jan. 28, 1993, abandoned.

[30] Foreign Application Priority Data

Jan. 31, 1992 [JP] Japan ..................................... 4-046307

[51] Int. Cl.$^6$ ..................................... H01L 21/20
[52] U.S. Cl. .............................. 437/86; 437/101; 437/974
[58] Field of Search .................................. 437/62, 71, 84, 437/86, 101, 974; 148/DIG. 1, DIG. 12, DIG. 135

[56] References Cited

U.S. PATENT DOCUMENTS

| | | | |
|---|---|---|---|
| 3,929,529 | 12/1975 | Poponiak | 148/DIG. 60 |
| 4,628,591 | 12/1986 | Zorinsky et al. | 437/84 |
| 5,013,681 | 5/1991 | Godbey et al. | 437/86 |
| 5,094,697 | 3/1992 | Takabayashi et al. | 136/249 |
| 5,147,808 | 9/1992 | Pronko | 437/974 |
| 5,240,876 | 8/1993 | Gaul et al. | 437/974 |

OTHER PUBLICATIONS

"Electrolytic Shaping of Germanium and Silicon" by A. Uhlir, Jr.; The Bell System Technical Journal vol. XXXV, 1956; pp. 333–347.

"A New Dielectric Isolation Method Using Porous Silicon" by Kazuo Imai; Solid-State Electronics, vol. 24, pp. 159–164, 1981.

"Solid Phase epitaxial seed for laser-crystallized silicon on glass substrates" by A. Doi et al.; Applied Physics Letters, vol. 59. No. 20, Nov. 11, 1991; pp. 2518–2520.

"Formation Mechanism of Porous Silicon Layer by Anodization in HF Solution" by T. Unagami; Journal of the Electrochemical Society; vol. 127 No. 2. Feb. 1980; pp. 476–483.

"Pore Size Distribution in Porous Silicon Studied by Adsorption Isotherms" by G. Bomchil et al.; Journal of the Electrochemical Society, vol. 130, No. 7, Jul. 1983 pp. 1611–1614.

"Single-Crystal Silicon on Non-Single-Crystal Insulators" edited by G. W. Cullen; Journal of Crystal Growth, vol. 63, No. 3 Oct. 11, 1983; Special Issue.

"Complete dielectric isolation by highly selective and self-stopping formation of oxidized porous silicon" by R. P. Holmstron et al., Applied Physics Letters, vol. 42, No. 3, Feb. 15, 1983, pp. 386–388.

*Primary Examiner*—Chandra Chaudhari
*Attorney, Agent, or Firm*—Fitzpatrick, Cella, Harper & Scinto

[57] ABSTRACT

A process for producing a semiconductor device substrate comprises the steps of making a first substrate member porous, forming an insulating layer on a second substrate member, forming an amorphous layer on the insulating layer on the second substrate member, bonding the porous first substrate member to the amorphous layer at a temperature of an atmosphere in which the amorphous layer at least does not crystallize, causing solid-phase epitaxial growth of the amorphous layer by utilizing the porous first substrate member as crystal growth seed, and removing the bonded first substrate member after completion of the epitaxial growth by chemical etching.

45 Claims, 15 Drawing Sheets

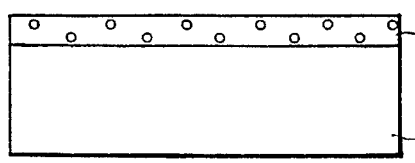
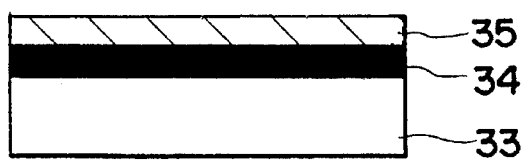
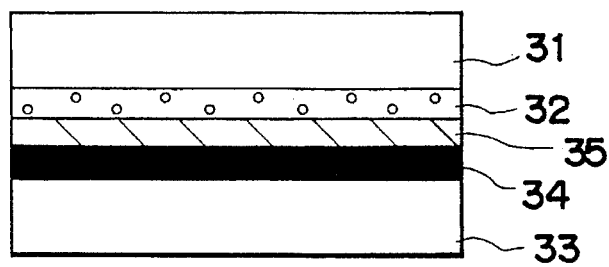
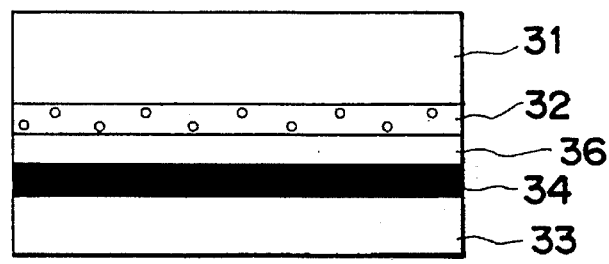
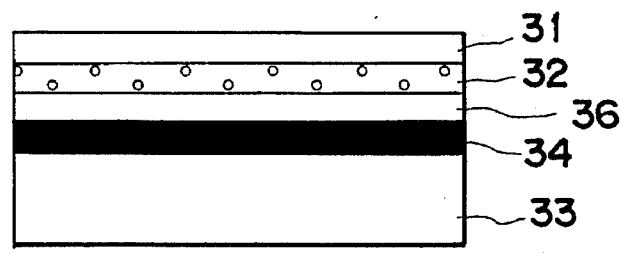
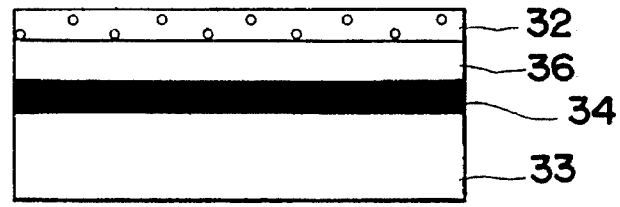
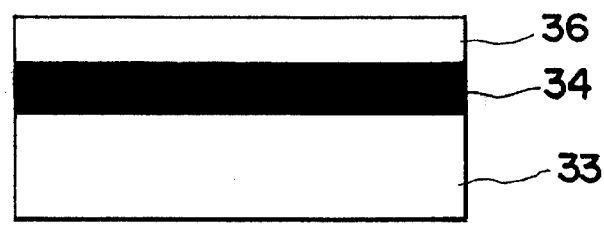

FIG. 12A  FIG. 12B
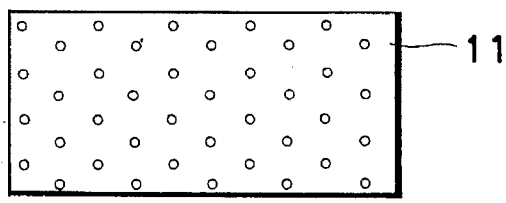
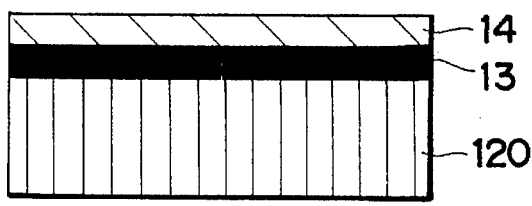
FIG. 12C
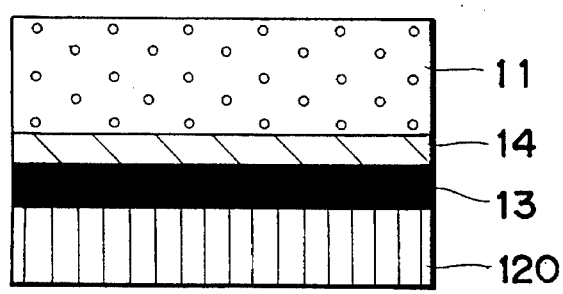
FIG. 12D
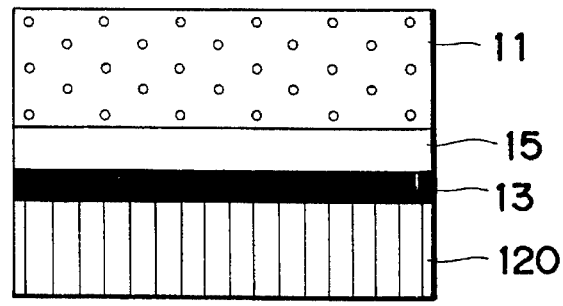
FIG. 12E
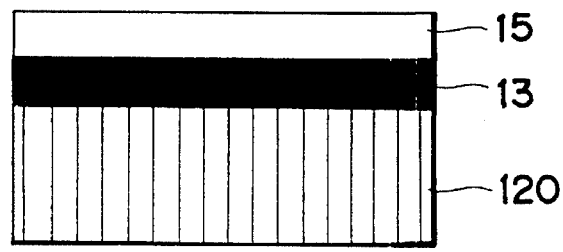

METHOD FOR PRODUCING SEMICONDUCTOR DEVICE SUBSTRATE BY BONDING A POROUS LAYER AND AN AMORPHOUS LAYER

This application is a continuation of application Ser. No. 08/284,265 filed Aug. 2, 1994, now abandoned, which is a continuation of application Ser. No. 08/010,627 filed Jan. 28, 1993, abandoned.

BACKGROUND OF THE INVENTION

1. Field of the Invention

The present invention relates to a semiconductor device substrate (a substrate for a semiconductor device) which is composed of monocrystal formed on an insulator and is useful widely for large-scale integrated circuits and the like. The present invention also relates to a process for producing the above semiconductor device substrate.

2. Related Background Art

A process for producing a semiconductor device substrate through formation of monocrystalline Si semiconductor layer on an insulator is well known as silicon-on-insulator technique (SOI). This SOI technique is widely utilized in device formation, since the SOI technique has many advantages which are not achievable with a bulk Si substrate production. The advantages brought about by the SOI technique are as below:

1. Ease of dielectric separation, and practicability of high integration,
2. High resistance against radioactive rays,
3. Low floating capacity, and practicability of high speed operation,
4. Practicability of omission of a welling step,
5. Practicability of prevention of latching-up,
6. Practicability of thin film formation for complete depletion type field effect transistor, and so forth.

The SOI technique is described in literature, for example: Special Issue: "Single-crystal silicon on non-single-crystal insulators" edited by G. W. Cullen: Journal of Crystal Growth, Vol. 63, No. 3, pp. 429–590 (1983).

Prior to the SOI technique, an SOS technique (silicon-on-sapphire) is known which forms heteroepitaxial Si on monocrystalline sapphire substrate by CVD (chemical vapor deposition). This SOS technique is not widely applied because of many crystal defects caused by insufficient coherency of the lattice at the interface between the Si layer and the underlying sapphire substrate, migration of aluminum from the sapphire substrate to the Si layer, and, above all, the high cost of the substrate and difficulty in enlarging the size thereof.

In recent years, the SOI structure without use of the sapphire substrate is going to be realized. This attempt is made in two ways: a first method comprises steps of oxidizing a surface of an monocrystalline Si substrate, forming an aperture in the oxidized layer to uncover partially the Si substrate, growing Si epitaxially in a lateral direction using the uncovered Si as the seed to form an monocrystalline Si layer on the $SiO_2$ (Si layer being deposited on $SiO_2$); and a second method comprises steps of forming $SiO_2$ under the monocrystalline Si substrate by use of the monocrystalline Si substrate itself as the active layer (no Si layer being deposited).

Of the above first method, the step of a solid-phase epitaxial growth is described below in detail. The solid-phase epitaxial growth is classified into vertical solid-phase epitaxial growth and lateral solid-phase epitaxial growth. The vertical solid-phase epitaxial growth is employed chiefly for crystallinity recovery after ion implantation. For formation of the SOI structure, the lateral solid-phase epitaxial growth is suitable. In the formation of the SOI structure by the lateral solid-phase epitaxial growth, $SiO_2$ having an aperture is formed on an Si substrate; amorphous Si is deposited over the entire face of the substrate; the vertical solid-phase epitaxial growth is carried out through the aperture; and then the lateral solid-phase epitaxial growth is carried out over the formed $SiO_2$. The solid-phase epitaxial growth is practicable at temperature of as low as about 600° C.

The SOI structure formation through the above-described solid-phase epitaxial growth involves problems below:

In the lateral solid-phase epitaxial growth, all the monocrystalline Si region has to be formed in the face direction, which necessitates growth in long distance and long time. The long growth time causes formation of nuclei in the amorphous Si, which inhibits the growth, and results in insufficient growth distance of only several µm. To solve this problem, countermeasures are taken such as adjustment of the pressure and beam irradiation to extend the growth distance, and introduction of an impurity to increase the growth velocity. However, with any of the aforementioned countermeasures, the growth distance in lateral direction is limited to several tens of µm at the largest, and an SOI of a larger area cannot be formed. Furthermore, the lateral solid-phase epitaxial growth is known to result in remarkably low crystallinity than the vertical solid-phase epitaxial growth and to cause a number of dislocation and twinning, which impairs directly the device properties.

Known techniques for forming the SOI structure by deposition include direct lateral epitaxial growth of monocrystalline Si by CVD; deposition of amorphous Si and subsequent lateral solid-phase epitaxial growth by heat treatment; irradiation of a focused energy beam such as electron beam and laser light beam on polycrystalline Si layer to grow monocrystalline layer on $SiO_2$ by melt-recrystallization; and scanning with a bar-shaped heater over a molten zone (zone melting recrystallization).

These methods, however, involve many problems in controllability, productivity, uniformity, quality, etc., and are not promising in industrial application. For example, the CVD process requires sacrificial oxidation for forming a thin flat film. The lateral solid-phase growth results in low crystallinity. The beam annealing process involves problems in treating time by a converged beam, control of superposition of the beam and focus adjustment. Of the above methods, zone melting recrystallization is most highly developed, and has been employed for experimental production of relatively large integrated circuits. This method, however, still causes crystal defects in subgrain boundary, etc., and does not give a minority carrier device.

Furthermore, conventional solid-phase epitaxial growth methods essentially require uncovered monocrystalline Si as the seed on the substrate surface, and cannot be practiced by use of a substrate other than monocrystalline Si.

Atsutoshi Doi, et al. reported that SOI was prepared by attaching and pressing a patterned monocrystalline silicon external seed on an amorphous silicon layer and then utilizing the crystalline region grown in solid phase by heat treatment as a seed for laser recrystallization in place of using a substrated as the seed for the laser recrystallization (A. Doi, et al., Appl. phys. Lett., 59, 2518 (1991); Tuda, et al., 1991 Autumn Applied Physics Society Lecture Preliminary Report, p. 621, 9p-C-2; Doi, et al., 1991 Spring Applied Physics Society Lecture Preliminary Report, p. 614, 28p-X-11; Doi, et al., 1990 Spring Applied Physics Society Lecture Preliminary Report, p. 608, 29p-ZF-7). This method is a laser recrystallization method having some problems in treating time of scanning a converged beam and control of superposition of the beam and focus adjustment and poor productivity, and therefore it is not industrially applied. Furthermore, since the seed for the laser recrystallization is formed by a solid-phase epitaxial growth from the external seed, the steps thereof are complicated and finally the crystallinity of the epitaxial Si layer remarkably goes bad in comparison with that of the original monocrystalline external seed. In addition, there is a problem that the external seed can not easily removed since it is bonded to the epitaxial layer by valence bond.

Koichiro Hoh, et al. reported that monocrystalline Si was brought in contact with the surface of amorphous Si deposited on $SiO_2$ and crystallization was carried out from it as a seed (Uzawa, et al., 41th Semiconductor Integrated Circuit Technology Symposium Lecture Papers, p. 37 (1991); K. Hoh, et al., Denki Kagaku, 59, 1079 (1991); Uzawa, et al., 1991 Autumn Applied Physics Society Lecture Preliminary Report, p. 621, 9p-C-1; Yasuda, et al., 1991 Spring Applied Physics Society Lecture Preliminary Report, p. 614, 28p-X-10). In this method, it is basically impossible to remove an external seed. Therefore, they has attempted that amorphous Si is epitaxially grown from metallic silicide as a seed which is obtained by contacting monocrystalline Si deposited with metal and epitaxially growing metallic silicide.

In case of Ni silicide, the lattice coherency with si is very good, but the crystallization temperature of Ni silicide is 750° C. or higher. Therefore, there is a problem that generation of nuclei in amorphous Si occurs to form polycrystal before epitaxial growth of Ni silicide. Furthermore, there is a problem that the lattice coherency of Co silicide having low crystallization temperature with Si is not good.

On basis of available data of X-ray diffraction, although the crystallinity of epitaxial Si is not evaluated in detail, a good crystallinity is not expected because of heteroepitaxial growth and solid-phase growth.

Accordingly, this method can not satisfy formation of a good epitaxial Si layer and removal of seed at the same time.

A substrate made of a different material such as light-transmissive substrate typified by glass, allows a deposited thin Si layer to grow only into an amorphous or polycrystalline layer under the influence of the disorderness of the crystal structure of the substrate, and therefore is unsuitable for production of devices of high performance. It is due to the amorphousness or the difference in periodicity of crystal structure of the substrate. Therefore, simple deposition of Si layer will not give excellent monocrystal layer.

The light-transmissive substrate is important in constructing a light-receiving device for a contact sensor, a projection type liquid crystal image displaying apparatus, and the like. In order to provide a sensor or image element (picture element) of a display apparatus in higher density, higher resolution, and higher fineness, high performance of the driving device is required. Therefore, the device on a light-transmissive substrate have to be made from monocrystal layer having excellent crystallinity.

Thus, amorphous Si or polycrystalline Si will not generally give a driving device which exhibits the satisfactory performance required nowadays or to be required in the future because of many defects in the crystal structure.

The formation of monocrystalline Si on another kind of material is an important technique in forming a three-dimensional combination with another functional device or in use, as a substrate, of material having properties not obtained by Si such as light transmissivity, high heat releasability, high mechanical strength, and low cost. However, the formation of excellent monocrystalline Si film on such a material is extremely difficult.

Recently in addition to the above conventional SOI formation processes, another method of forming SOI structure is attracting attention in which a monocrystalline Si substrate is bonded to another thermally oxidized monocrystalline Si substrate by heat treatment or with an adhesive. This method requires an active layer formed in a uniform thin film for the device. That is, the monocrystalline Si substrate of several hundred microns in thickness has to be made into a thin film of several micron or thinner.

This thin film formation is practicable in two ways: (1) thin film formation by polishing, and (2) thin film formation by selective etching.

In the former method, i.e., polishing, it is not easy to form a uniform thin film. In particular, in formation of a film of submicron thick, the variation of the film thickness amounts to several tens of %, which is a serious problem. Moreover, for larger diameter of wafer, the thin film formation is much more difficult.

The latter method, i.e., the selective etching, although it is considered to be effective in formation of a uniform thin film, involves problems such that the selectivity is $10^2$ or lower and is insufficient; the surface property is inferior after etching; the crystallinity of the SOI layer is low as the result of utilizing ion implantation and epitaxial growth or heteroepitaxial growth on an Si layer doped with B in high density (C. Harendt, et al., J. Elect. Mater., Vol. 20, p. 267 (1991); H. Baumgart, et al., Extended Abstract of ECS 1st International Symposium of Water Bonding, p. 733 (1991); and C. E. Hunt, Extended Abstract of ECS 1st International Symposium of water Bonding, p. 696 (1991)).

Accordingly, the SOI preparation by bonding at present has many problems in the controllability and the uniformity. Furthermore, preparation of light-transmissive SOI by bonding has a serious problem of difference of thermal expansion coefficients.

SUMMARY OF THE INVENTION

An object of the present invention is to solve the above-described problems of the prior art.

Another object of the present invention is to provide a process for producing a semiconductor device substrate capable of forming a semiconductor layer of a large area having remarkably less defects on an insulating layer.

Still another object of the present invention is to provide at low cost a semiconductor device substrate for SOI substrate in place of expensive SOS or SIMOX.

Still another object of the present invention is to provide a process for producing a semiconductor device substrate comprising the steps of making a first substrate porous, forming an insulating layer on a second substrate, forming an amorphous layer on the insulating layer on the second substrate, bonding the porous first substrate to the amorphous layer at a temperature of an atmosphere in which the amorphous layer at least does not crystallize, causing solid-phase epitaxial growth of the amorphous layer by utilizing the porous first substrate as crystal growth seed, and removing the bonded first substrate after completion of the epitaxial growth.

BRIEF DESCRIPTION OF THE DRAWINGS

FIGS. 3A to 3G are schematic views for explaining one example of the production process of the present invention.

FIGS. 12A to 12E are schematic views for explaining one example of the production process of the present invention.

DETAILED DESCRIPTION OF THE PREFERRED EMBODIMENT

The process for producing a semiconductor device substrate of the present invention comprises the steps of making a first substrate porous, forming an insulating layer on a second substrate, forming an amorphous layer on the insulating layer on the second substrate, bonding the porous first substrate to the amorphous layer at a temperature of an atmosphere in which the amorphous layer at least does not crystallize, causing solid-phase epitaxial growth of the amorphous layer by utilizing the porous first substrate as crystal growth seed, and removing the bonded first substrate after completion of the epitaxial growth.

The process of the present invention is practicable by selectively chemical etching the porous Si without etching crystalline Si by use of a wet type chemical etching solution which does not adversely affect the semiconductor process.

The selective etching of the porous Si in the present invention is conducted by use, as a selective etching solution having no etching action on crystal Si, of hydrofluoric acid or buffered hydrofluoric acid, or a mixture of hydrofluoric acid or buffered hydrofluoric acid with at least one of an alcohol and an aqueous hydroperoxide solution.

Further, in the process for producing a semiconductor device substrate of the present invention, monocrystalline Si is formed on different materials from it.

Furthermore, in the process for producing a semiconductor device substrate of the present invention, selective etching is conducted in two steps in which the etching selectivity at the second step is extraordinarily high.

The present invention is described specifically referring to some embodiments.

Embodiment 1

The porous Si substrate formed on the first substrate member has pores of about 600 Å in average diameter formed therein according to observation by transmission electron microscopy, and retains monocrystallinity in spite of the low density of half or less of the monocrystalline Si density. Therefore, a monocrystalline Si layer can be grown on the porous layer. At a temperature higher than 1000° C., however, the internal pores rearrange and the accelerated etching characteristics is impaired. Therefore, for epitaxial growth of the Si layer, low temperature growth methods such as molecular beam epitaxial growth, plasma CVD, low pressure CVD, photo-assisted CVD, bias sputtering and liquid phase growth methods are suitable.

Figure 1A:
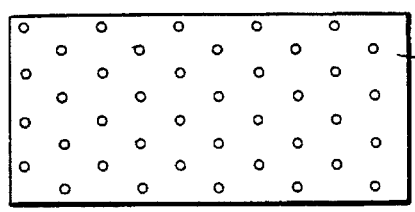
FIGS. 1A to 1E are schematic views for explaining one example of the production process of the present invention.
Figure 1B:
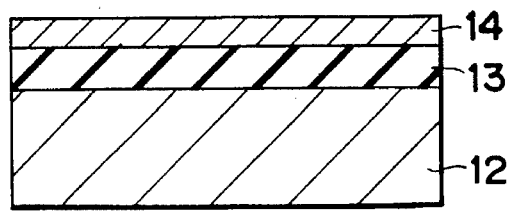

In this Embodiment, an Si substrate 11 as a first substrate member shown in FIG. 1A is a P-type monocrystalline Si substrate. It is made porous as a whole. On one face of another Si substrate 12 as a second substrate member as shown in FIG. 1B, an insulating layer 13, and further thereon an amorphous Si layer 14 are formed.

The porous structure of the Si substrate 11 is obtained by anodization in an HF solution. The density of the porous Si layer can be varied in the range of from 1.1 to 0.6 g/cm$^3$ by varying the HF concentration from 50% to 20% in comparison with the density 2.33 g/cm$^3$ of monocrystalline Si. This porous structure is not formed in an N-type Si layer, but is formed only in a P-type Si layer for the reason mentioned below. This porous Si layer has pores of about 600 Å in average diameter according to observation by transmission electron microscopy.

The porous monocrystalline Si was found in the year 1956 in the course of study on electropolishing of semiconductors by A. Uhlir, et al. (A. Uhlir, et al.: Bell Syst. Tech. J., Vol. 35, p. 333 (1956)). Unagami, et al. reported that positive holes are necessary for anodic reaction of Si in an HF solution and the reaction proceeds according to the formulas below (T. Unagami: J. Electrochem. Soc., Vol. 127, p. 476 (1980)),:

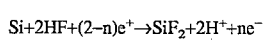

$$Si+2HF+(2-n)e^+ \rightarrow SiF_2+2H^++ne^-$$

$$SiF_2+2HF \rightarrow SiF_4+H_2$$

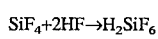

$$SiF_4+2HF \rightarrow H_2SiF_6$$

or otherwise,

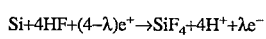

$$Si+4HF+(4-\lambda)e^+ \rightarrow SiF_4+4H^++\lambda e^-$$

$$SiF_4+2HF \rightarrow H_2SiF_6$$

where $e^+$ and $e^-$ represent respectively a positive hole and an electron; n and λ represent respectively the number of the positive holes required for dissolving one atom of Si, and it was also reported that porous monocrystalline Si is formed if n>2, or λ>4.

Accordingly, it is understood that a P-type Si having positive holes is made porous, but an N-type Si cannot be made porous. This selectivity in porous structure formation has already been actually proved by Nagano, et al., and Imai (Nagano, Nakajima, Yasuno, Ohnaka, and Kajihara, Densi Tsushin Gakkai Gijyutsu Kenkyu Hokoku Vol. 79, SSD 79-9549 (1979): and K. Imai, Solid-State Electronics, Vol. 24, p. 159 (1981)).

On the other hand, it was also reported that high-concentration N-type Si can also be made porous (R. P. Holmstorm and J. Y. Chi, Appl. Phys. Lett., Vol. 42, p. 386 (1983)). Therefore it is important to select the substrate capable of being made porous whether conductive type is P-type or N-type.

The porous layer has a density of half of or less than the density of the nonporous layer because of the large amount of void in the interior thereof, and has greater surface area for the volume. Consequently, the chemical etching rate of it is significantly greater than that of a normal monocrystalline layer.

Figure 1C:
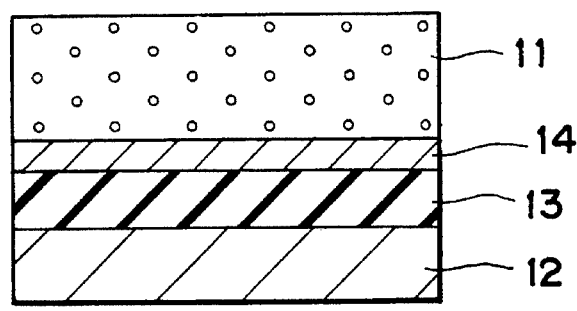

After the porous structure formation, one face of the porous Si substrate 11 as the first substrate member is bonded to the face of the amorphous Si layer 14 of a second Si substrate member as shown in FIG. 1C. The bonded substrates are subjected to heat treatment at a temperature lower than the crystallization temperature of the amorphous Si, thereby the face of the porous Si 11 and the face of the amorphous Si 14 are bonded tightly.

Figure 1D:
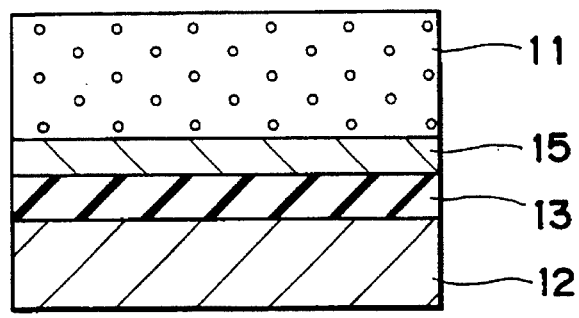

Subsequently, the bonded two substrate members are heat-treated to turn the amorphous Si 14 into a monocrystalline Si layer 15 by solid-phase epitaxial growth by utilizing the porous Si layer 11 as crystal-growth seed as shown in FIG. 1D. Since this solid-phase growth occurs in a vertical direction, the epitaxial growth is completed in a short time, and the crystal defects are considerably less than in lateral solid-phase epitaxial growth.

After the completion of the epitaxial growth, the porous Si layer 11 only is removed by chemical etching while the monocrystalline Si left on the insulating layer 13.

Figure 1E:
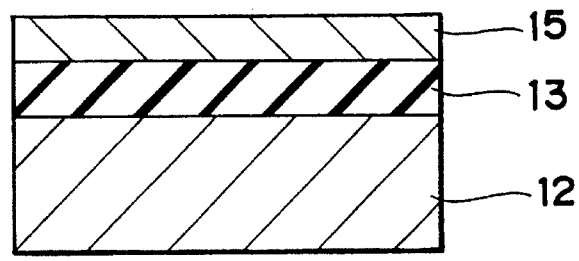

FIG. 1E shows the state after removal of the porous Si layer by etching. Thereby, the insulating layer 13 and the monocrystalline Si layer 15 is formed in a flat and uniform state, and over a large area of the entire wafer. The resulting semiconductor device substrate is excellent for insulation-separated electronic devices.

FIGS. 12A to 12E show examples in which a second substrate member 120 is made of a material different from Si.

FIGS. 13A to 13E show examples in which an insulating layer is not formed on a second substrate member 220.

The method of removal of the porous layer by chemical etching which is essential in the present invention is explained below.

Generally, the porosity (P) is represented by the equation (1) below:

$$P=(2.33-A)/2.33 \tag{1}$$

The value of P can be varied in the step of the anodization, and can be represented by the equation below:

$$P=(m_1-m_2)/(m_1-m_3) \tag{2}$$

$$P=(m_1-m_2)/\rho At \tag{3}$$

where $m_1$: total weight before anodization $m_2$: total weight after anodization $m_3$: total weight after removal of porous Si $\rho$: density of monocrystalline Si A: area made porous t: thickness of porous Si The area of the region made porous cannot frequently be precisely estimated. In such a case, the equation (2) is useful. However, for measuring the value of $m_3$, the porous Si have to be etched off.

In the aforementioned epitaxial growth on the porous Si, the porous Si can prevent the occurrence of defects. In this case, however, it is evident that the porosity of Si is an important parameter for relaxation of strain caused by heteroepitaxial growth because of the nature of the porous structure. Therefore, the measurement of the porosity is indispensable.

The known methods for the etching of porous Si include: (1) etching of porous Si with aqueous NaOH solution (G. Bonchil, R. Herino, K. Barla, and J. C. Pfister: J. Electrochem. Soc., Vol. 130, no. 7, p. 1611 (1983)), and (2) etching of porous Si with an etching solution capable of etching monocrystalline Si.

In the above method (2), a hydrofluoric nitric acid type etching solution is used normally. With this etching solution, the etching proceeds with oxidation of Si by nitric acid to form $SiO_2$ and subsequent etching of the resulting $SiO_2$ by hydrofluoric acid as shown below:

$$Si+2O \rightarrow SiO_2 \tag{4}$$

$$SiO_2+4HF \rightarrow SiF_4+2H_2O \tag{5}$$

The known methods for etching crystalline Si further include etching with an ethylenediamine type, KOH type, or hydrazine type of etching solution as well as the above hydrofluoric nitric acid type etching solution.

From the consideration above, for selective etching of the porous Si, an etching solution capable of etching the porous Si need to be selected from etching solutions other than the above Si-etching solutions. The selective etching of porous Si is conventionally conducted only by use of aqueous NaOH solution. When hydrofluoric nitric acid type etching solution is used, not only amorphous Si but also crystalline Si is etched off.

In the conventional selective etching of porous Si with aqueous NaOH solution, Na ion is adsorbed inevitably on the etched surface. This Na ion becomes a main source of impurity contamination, and should not be introduced on the semiconductor production process since it gives adverse effects such as formation of an interfacial level.

Figure 4:
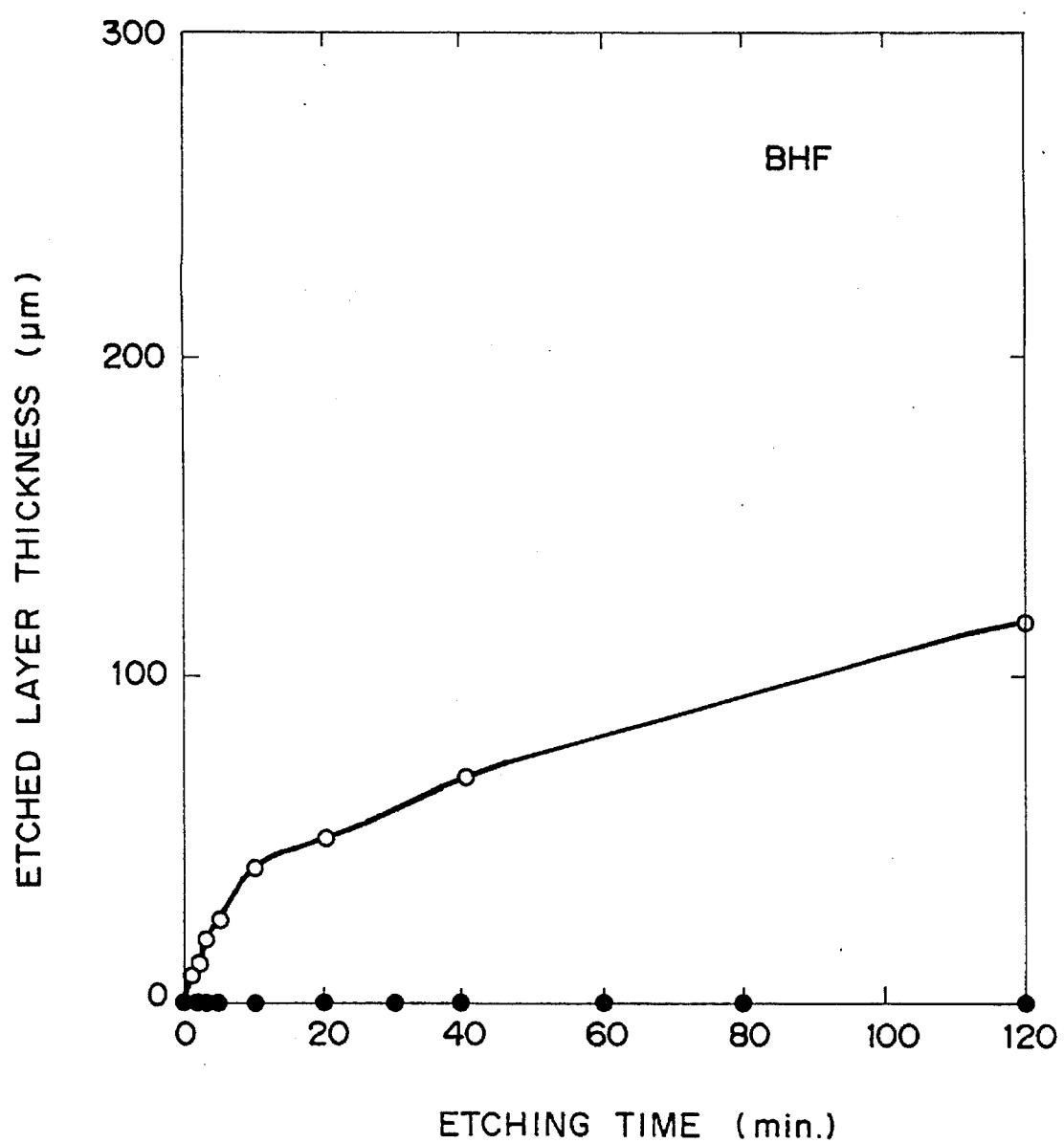
FIG. 4 is a graph showing the etching characteristics of porous Si and nonporous Si in etching with buffered hydrofluoric acid.

FIG. 4 shows the dependency of the etched layer thicknesses (thickness decreases) of porous Si and monocrystalline Si on etching time in the case where the porous Si and monocrystalline Si were respectively etched by immersion in buffered hydrofluoric acid ($NH_4F$: 36%, HF: 4.5%) with stirring. The porous Si was prepared by anodization of monocrystalline Si under the conditions below. The starting material for the porous Si to be formed by the anodization is not limited to monocrystalline Si but any other crystal structure of Si may be employed.

| Applied voltage: | 2.6 V |
| --- | --- |
| Current density: | 30 mA · cm$^{-2}$ |
| Anodization solution: | HF:H$_2$O:C$_2$H$_5$OH = 1:1:1 |
| Time: | 2.4 hours |

| | |
|---|---|
| Porous Si thickness: | 300 μm |
| Porosity: | 56% |

The porous Si prepared under the above conditions was etched by immersion in the buffered hydrofluoric acid with stirring at room temperature. The decrease of the thickness of the porous Si was measured later. The progress of the etching is shown by blank circles (o). The porous Si was etched rapidly (70 μm in 40 minutes and 118 μm in 120 minutes) uniformly with retention of satisfactory surface property. The etching rate depends on the concentration of the solution and the temperature.

Separately, nonporous Si of 500 μm thick was etched by immersion in the buffered hydrofluoric acid with stirring at room temperature. The decrease of the thickness was measured later. The progress of the etching is shown by solid circles (●). The nonporous Si was etched by not more than 50 Å even after 120 minutes.

After the etching, the porous Si and the nonporous Si were washed with water. The surfaces were observed by secondary ion mass spectrometry to detect no impurity.

The conditions of the solution concentration and the temperature are decided within the range that the etching rate of the porous Si and the selectivity of the etching of the porous Si relative to nonporous Si are allowable in the production process, and the effect of the alcohol is achievable.

Figure 5:
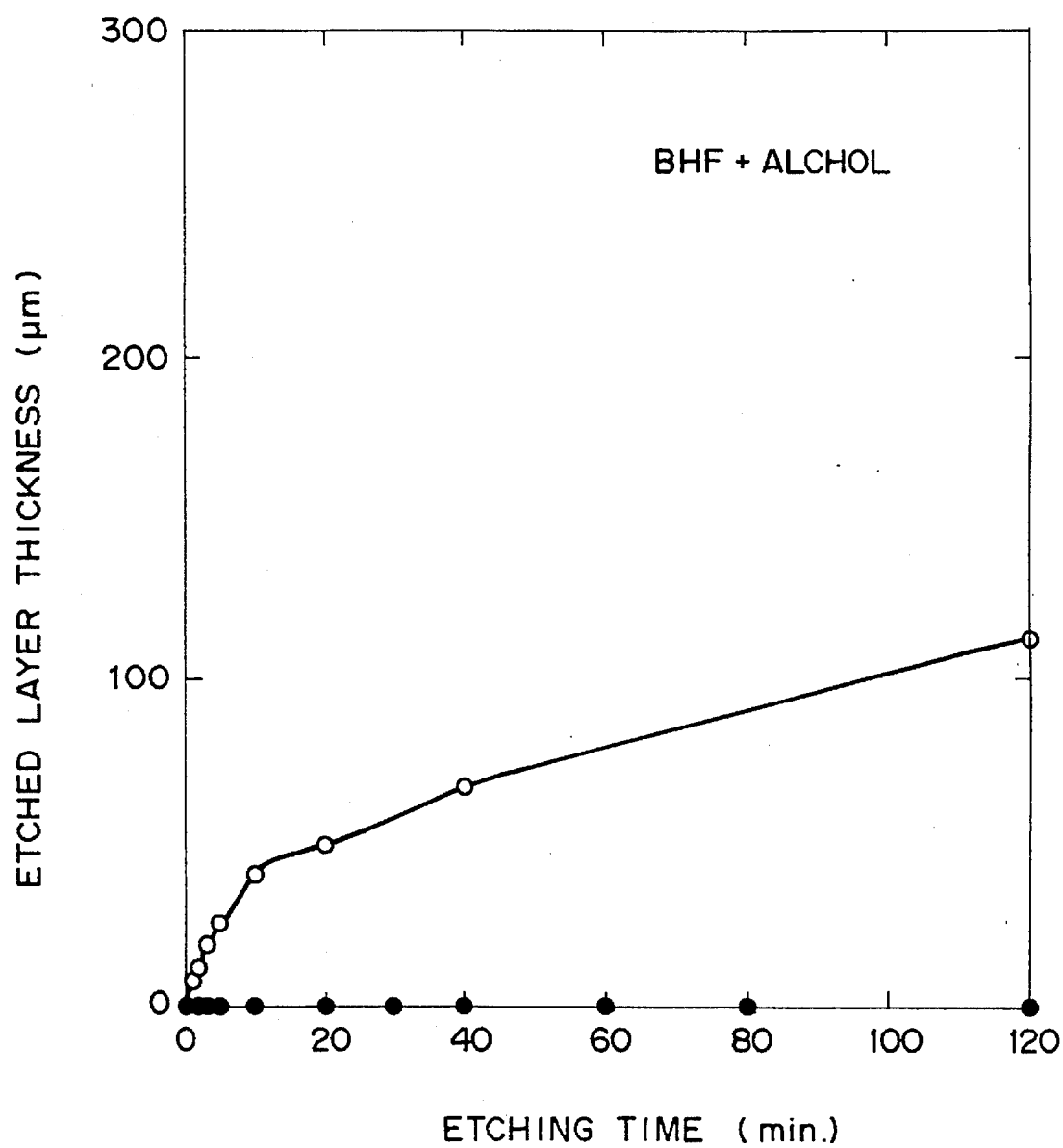
FIG. 5 is a graph showing the etching characteristics of porous Si and nonporous Si in etching with a mixture of buffered hydrofluoric acid and alcohol.

FIG. 5 shows the dependency of the etched layer thicknesses (thickness decreases) of porous Si and monocrystalline Si on etching time in the case where the porous Si and monocrystalline Si were respectively etched by immersion in a 10:1 mixture of buffered hydrofluoric acid (NH$_4$F: 36%, HF: 4.5%) and alcohol without stirring. The porous Si was prepared by anodization of monocrystalline Si under the conditions below. The starting material for the porous Si to be formed by the anodization is not limited to monocrystalline Si but any other crystal structure of Si may be employed.

| | |
|---|---|
| Applied voltage: | 2.6 V |
| Current density: | 30 mA · cm$^{-2}$ |
| Anodization solution: | HF:H$_2$O:C$_2$H$_5$OH = 1:1:1 |
| Time: | 2.4 hours |
| Porous Si thickness: | 300 μm |
| Porosity: | 56% |

The porous Si prepared under the above conditions was etched by immersion in the 10:1 mixture of buffered hydrofluoric acid and alcohol at room temperature without stirring. The decrease of the thickness of the porous Si was measured later. The progress of the etching is shown by blank circles (o). The porous Si was etched rapidly (67 μm in 40 minutes and 112 μm in 120 minutes) uniformly with retention of satisfactory surface property. The etching rate depends on the concentration of the solution and the temperature.

Separately, nonporous Si of 500 μm thick was etched by immersion in the 10:1 mixture of buffered hydrofluoric acid and alcohol at room temperature without stirring. The decrease of the thickness was measured later. The progress of the etching is shown by solid circles (●). The nonporous Si was etched by not more than 50 Å even after 120 minutes of etching.

In particular, the addition of alcohol allows the instantaneous removal of bubbles formed by the etching reaction from the etched surface without stirring, thus enabling uniform and effective etching of the porous Si.

After the etching, the porous Si and the nonporous Si were washed with water. The surfaces were observed by secondary ion mass spectrometry to detect no impurity.

The conditions of the solution concentration and the temperature are decided within the range that the etching rate of the porous Si and the selectivity of the etching of the porous Si relative to nonporous Si are allowable in the production process, and the effect of the alcohol is achievable.

Figure 6:
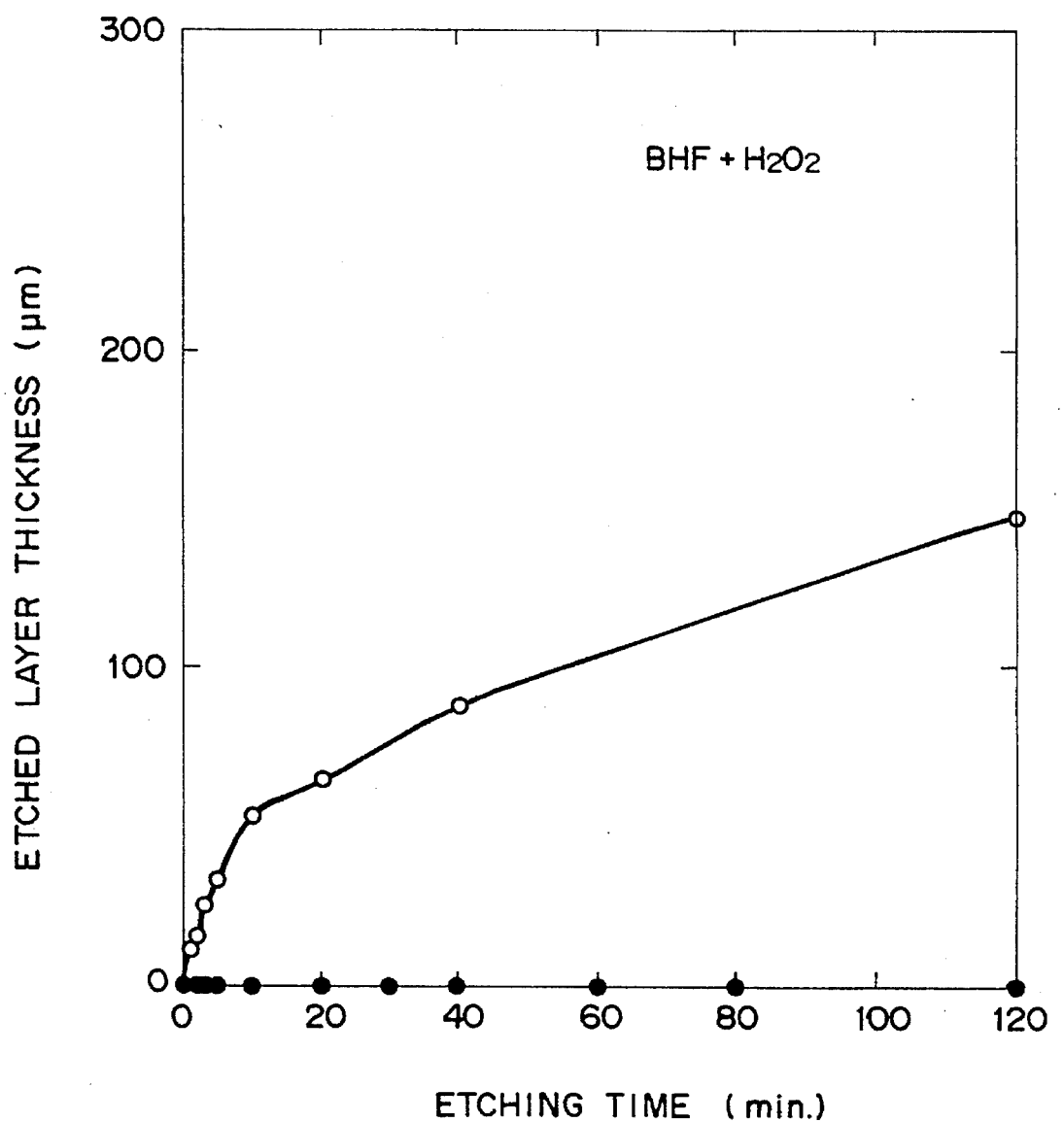
FIG. 6 is a graph showing the etching characteristics of porous Si and nonporous Si to in etching with a mixture of buffered hydrofluoric acid and aqueous hydrogen peroxide.

FIG. 6 shows the dependency of the etched layer thicknesses (thickness decreases) of porous Si and monocrystalline Si on etching time in the case where the porous Si and monocrystalline Si were respectively etched by immersion in a 1:5 mixture of buffered hydrofluoric acid (NH$_4$F: 36%, HF: 4.5%) and aqueous 30% hydrogen peroxide solution with stirring. The porous Si was prepared by anodization of monocrystalline Si under the conditions below. The starting material for the porous Si to be formed by the anodization is not limited to monocrystalline Si but any other crystal structure of Si may be employed.

| | |
|---|---|
| Applied voltage: | 2.6 V |
| Current density: | 30 mA · cm$^{-2}$ |
| Anodization solution: | HF:H$_2$O:C$_2$H$_5$OH = 1:1:1 |
| Time: | 2.4 hours |
| Porous Si thickness: | 300 μm |
| Porosity: | 56% |

The porous Si prepared under the above conditions was etched by immersion in a 1:5 mixture of buffered hydrofluoric acid and aqueous 30% hydrogen peroxide solution at room temperature without stirring. The decrease of the thickness of the porous Si was measured later. The progress of the etching is shown by blank circles (o). The porous Si was etched rapidly (88 μm in 40 minutes and 147 μm in 120 minutes) uniformly with retention of satisfactory surface property. The etching rate depends on the concentration of the solution and the temperature.

Separately, nonporous Si of 500 μm thick was etched by immersion in the 1:5 mixture of buffered hydrofluoric acid and aqueous 30% hydrogen peroxide solution at room temperature with stirring. The decrease of the thickness was measured later. The progress of the etching is shown by solid circles (●). The nonporous Si was etched by not more than 50 Å even after 120 minutes of etching.

In particular, the addition of the aqueous hydrogen peroxide solution accelerates the oxidation of silicon, and thereby accelerates the reaction velocity in comparison with the case of absence of hydrogen peroxide. Further the reaction velocity can be controlled by changing the ratio of the hydrogen peroxide solution.

After the etching, the porous Si and the nonporous Si were washed with water. The surfaces were observed by secondary ion mass spectrometry to detect no impurity.

The conditions of the solution concentration and the temperature are decided within the range that the etching rate of the porous Si and the selectivity of the etching of the porous Si relative to nonporous Si are allowable in the production process, and the effect of the alcohol is achievable.

Figure 7:
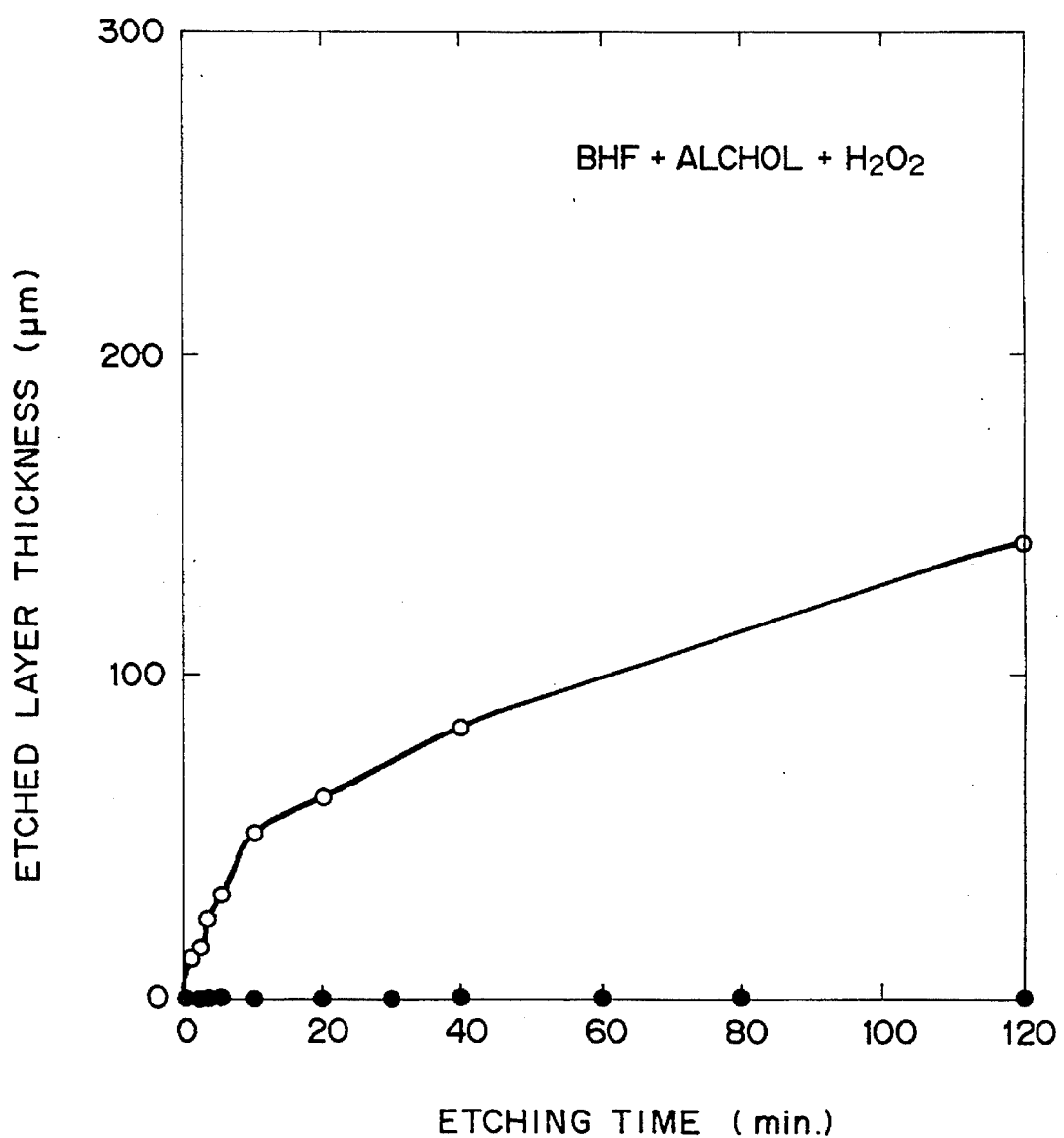
FIG. 7 is a graph showing the etching characteristics of porous Si and nonporous Si in etching with a mixture of buffered hydrofluoric acid, alcohol, and aqueous hydrogen peroxide.

FIG. 7 shows the dependency of the etched layer thicknesses (thickness decreases) of porous Si and monocrystalline Si on etching time in the case where the porous Si and monocrystalline Si were respectively etched by immersion in a 10:6:50 mixture of buffered hydrofluoric acid (NH$_4$F: 36%, HF: 4.5%), alcohol and aqueous 30% hydrogen peroxide solution without stirring. The porous Si was prepared by anodization of monocrystalline Si under the conditions below. The starting material for the porous Si to be formed by the anodization is not limited to monocrystalline Si but any other crystal structure of Si may be employed.

| | |
|---|---|
| Applied voltage: | 2.6 V |
| Current density: | 30 mA · cm$^{-2}$ |
| Anodization solution: | HF:H$_2$O:C$_2$H$_5$OH = 1:1:1 |
| Time: | 2.4 hours |
| Porous Si thickness: | 300 μm |
| Porosity: | 56% |

The porous Si prepared under the above conditions was etched by immersion in a 10:6:50 mixture of buffered hydrofluoric acid, alcohol and aqueous 30% hydrogen peroxide solution at room temperature without stirring. The decrease of the thickness of the porous Si was measured later. The progress of the etching is shown by blank circles (○). The porous Si was etched rapidly (83 μm in 40 minutes and 140 μm in 120 minutes) uniformly with retention of satisfactory surface property. The etching rate depends on the concentration of the solution and the temperature.

Separately, nonporous Si of 500 μm thick was etched by immersion in the 10:6:50 mixture of buffered hydrofluoric acid, alcohol and aqueous 30% hydrogen peroxide solution at room temperature without stirring. The decrease of the thickness was measured later. The progress of the etching is shown by solid circles (●). The nonporous Si was etched by not more than 50 Å even after 120 minutes of etching.

The addition of the aqueous hydrogen peroxide solution accelerates the oxidation of silicon, and thereby increases the reaction velocity in comparison with the case where hydrogen peroxide is absent. Further the reaction velocity can be controlled by changing the ratio of the hydrogen peroxide solution.

The addition of alcohol allows the instantaneous removal of bubbles formed by the etching reaction from the etched surface without stirring, thus enabling uniform and effective etching of the porous Si.

After the etching, the porous Si and the nonporous Si were washed with water. The surfaces were observed by secondary ion mass spectrometry to detect no impurity.

The conditions of the solution concentration and the temperature are decided within the range that the etching rate of the porous Si and the selectivity of the etching of the porous Si relative to nonporous Si are allowable in the production process, and the effect of the alcohol is achievable.

Figure 8:
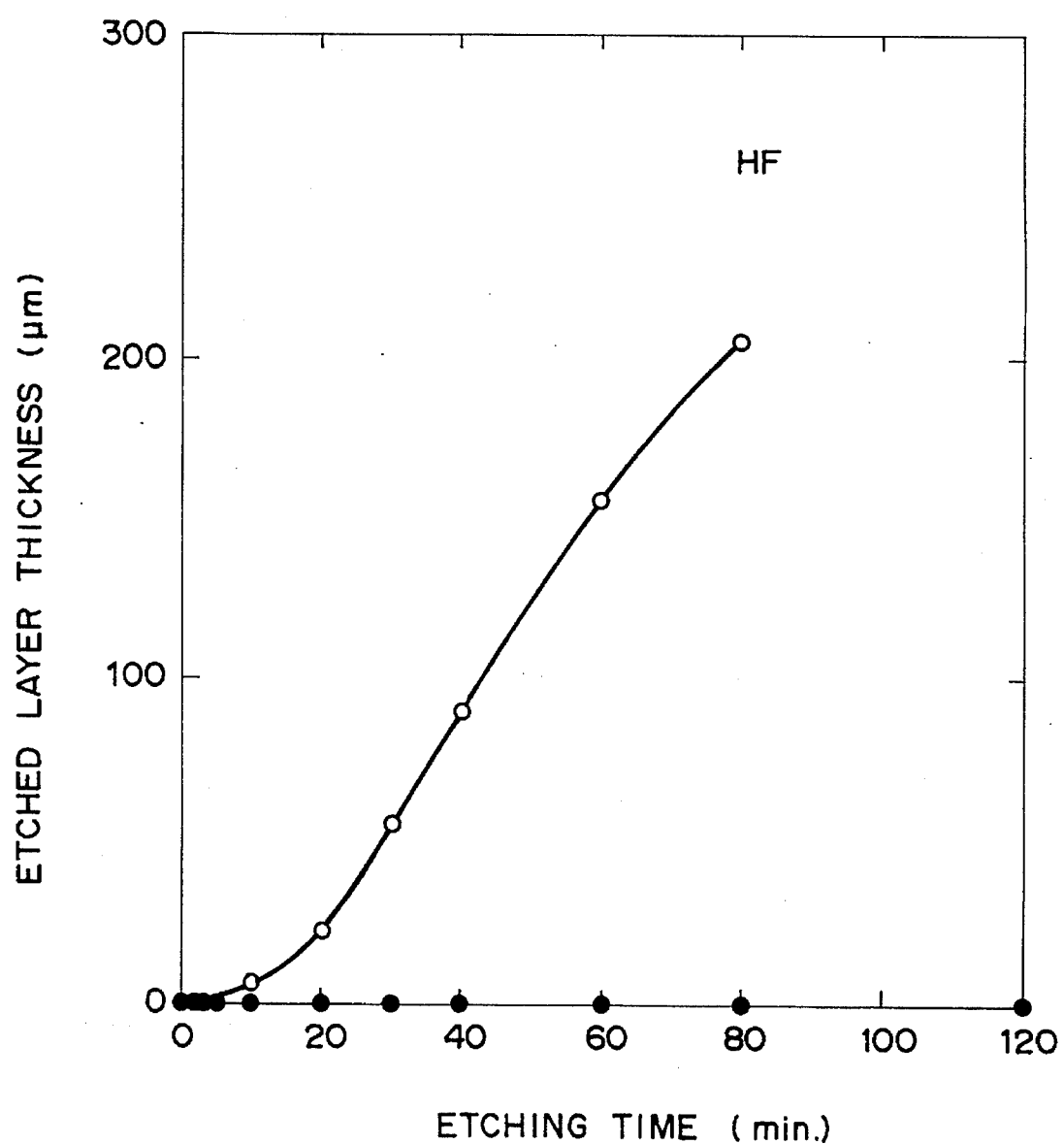
FIG. 8 is a graph showing the etching characteristics of porous Si and nonporous Si in etching with hydrofluoric acid.

FIG. 8 shows the dependency of the etched layer thicknesses (thickness decreases) of porous Si and monocrystalline Si on etching time in the case where the porous Si and monocrystalline Si were respectively etched by immersion in 49% hydrofluoric acid with stirring. The porous Si was prepared by anodization of monocrystalline Si under the conditions below. The starting material for the porous Si to be formed by the anodization is not limited to monocrystalline Si but any other crystal structure of Si may be employed.

| | |
|---|---|
| Applied voltage: | 2.6 V |
| Current density: | 30 mA · cm$^{-2}$ |
| Anodization solution: | HF:H$_2$O:C$_2$H$_5$OH = 1:1:1 |
| Time: | 2.4 hours |
| Porous Si thickness: | 300 μm |
| Porosity: | 56% |

The porous Si prepared under the above conditions was etched by immersion in 49% hydrofluoric acid with stirring at room temperature. The decrease of the thickness of the porous Si was measured later. The progress of the etching is shown by blank circles (○). The porous Si was etched rapidly (90 μm in 40 minutes and 205 μm in 80 minutes) uniformly with retention of satisfactory surface property. The etching rate depends on the concentration of the solution and the temperature.

Separately, nonporous Si of 500 μm thick was etched by immersion in 49% hydrofluoric acid with stirring at room temperature. The decrease of the thickness was measured later. The progress of the etching is shown by solid circles (●). The nonporous Si was etched by not more than 50 Å even after 80 minutes.

After the etching, the porous Si and the nonporous Si were washed with water. The surfaces were observed by secondary ion mass spectrometry to detect no impurity.

The conditions of the solution concentration and the temperature are decided within the range that the etching rate of the porous Si and the selectivity of the etching of the porous Si relative to nonporous Si are allowable in the production process, and the effect of the alcohol is achievable.

Figure 9:
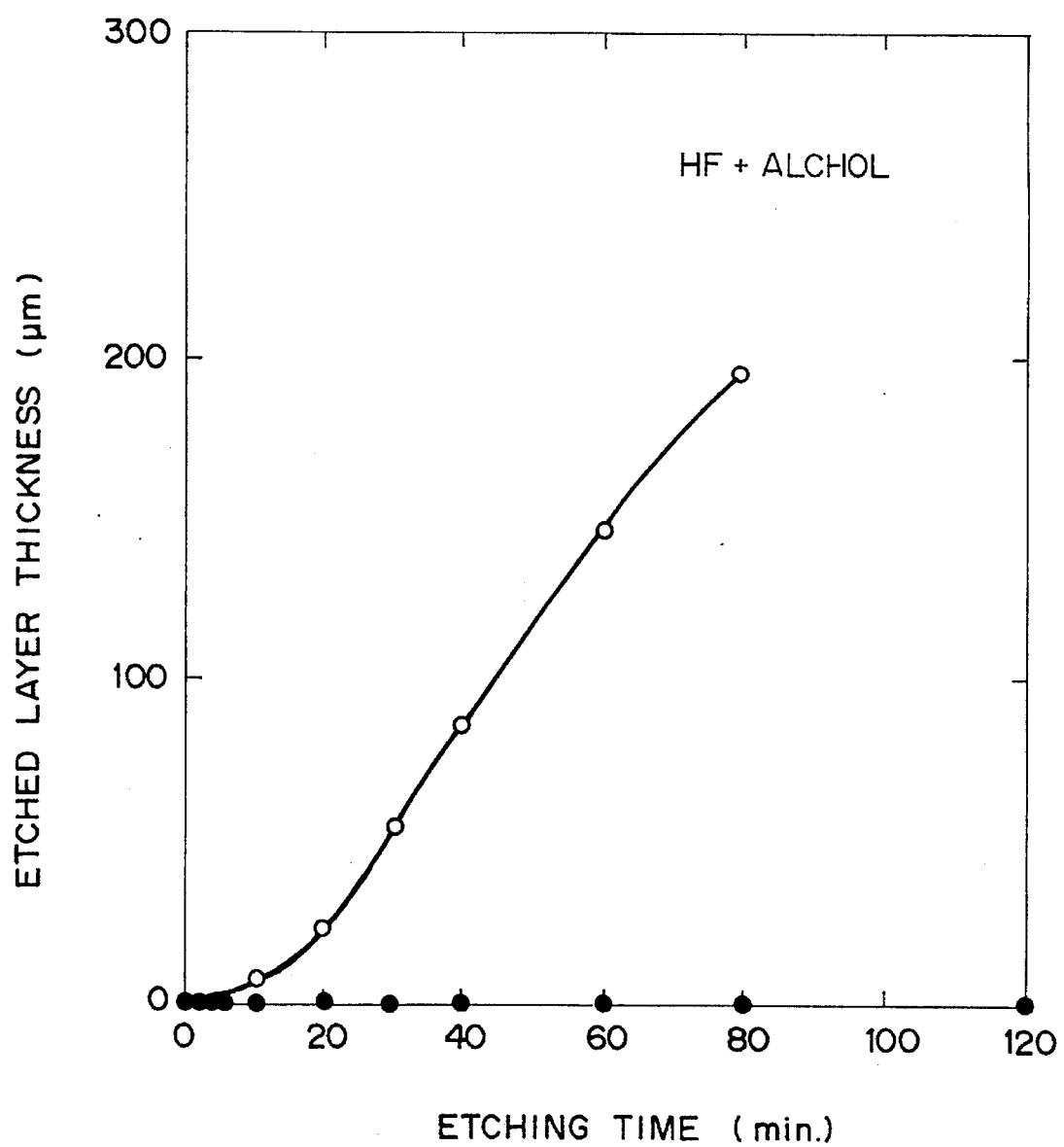
FIG. 9 is a graph showing the etching characteristics of porous Si and nonporous Si in etching with a mixture of hydrofluoric acid and alcohol.

FIG. 9 shows the dependency of the etched layer thicknesses (thickness decreases) of porous Si and monocrystalline Si on etching time in the case where the porous Si and monocrystalline Si were respectively etched by immersion in a 10:1 mixture of 49% hydrofluoric acid and alcohol without stirring. The porous Si was prepared by anodization of monocrystalline Si under the conditions below. The starting material for the porous Si to be formed by the anodization is not limited to monocrystalline Si but any other crystal structure of Si may be employed.

| | |
|---|---|
| Applied voltage: | 2.6 V |
| Current density: | 30 mA · cm$^{-2}$ |
| Anodization solution: | HF:H$_2$O:C$_2$H$_5$OH = 1:1:1 |
| Time: | 2.4 hours |
| Porous Si thickness: | 300 μm |
| Porosity: | 56% |

The porous Si prepared under the above conditions was etched by immersion in a 10:1 mixture of 49% hydrofluoric acid and alcohol at room temperature without stirring. The decrease of the thickness of the porous Si was measured later. The progress of the etching is shown by blank circles (○). The porous Si was etched rapidly (85 μm in 40 minutes and 195 μm in 80 minutes) uniformly with retention of satisfactory surface property. The etching rate depends on the solution concentration and the temperature.

Separately, nonporous Si of 500 μm thick was etched by immersion in the 10:1 mixture of 49% hydrofluoric acid and alcohol at room temperature without stirring. The decrease of the thickness was measured later. The progress of the etching is shown by solid circles (●). The nonporous Si was etched by not more than 50 Å even after 80 minutes of etching.

The addition of alcohol allows the instantaneous removal of bubbles formed by the etching reaction from the etched surface without stirring, thus enabling uniform and effective etching of the porous Si.

After the etching, the porous Si and the nonporous Si were washed with water. The surfaces were observed by secondary ion mass spectrometry to detect no impurity.

The conditions of the solution concentration and the temperature are decided within the range that the etching rate of the porous Si and the selectivity of the etching of the porous Si relative to nonporous Si are allowable in the production process, and the effect of the alcohol is achievable.

Figure 10:
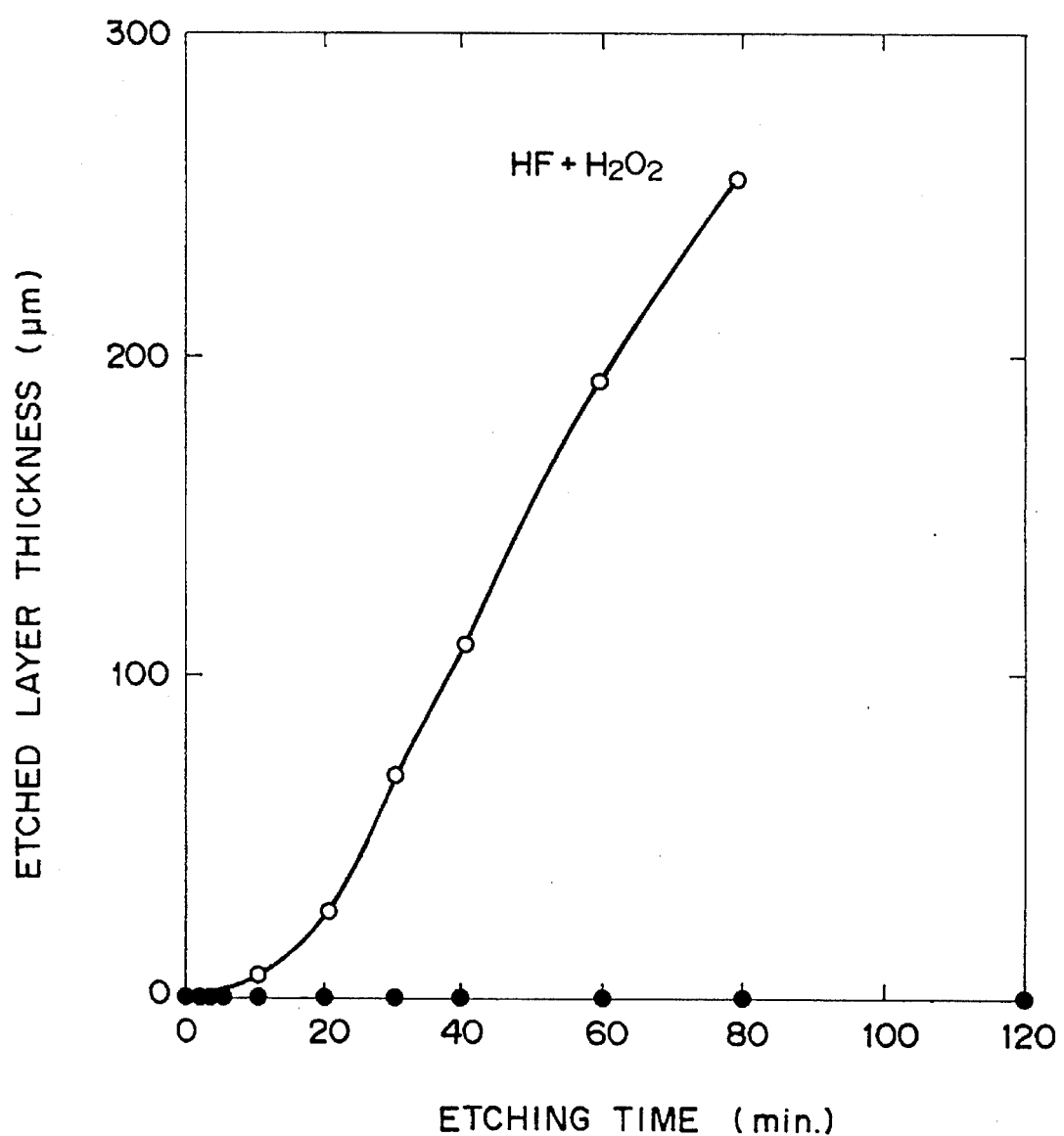
FIG. 10 is a graph showing the etching characteristics of porous Si and nonporous Si in etching with a mixture of hydrofluoric acid and aqueous hydrogen peroxide.

FIG. 10 shows the dependency of the etched layer thicknesses (thickness decreases) of porous Si and monocrystalline Si on etching time in the case where the porous Si and monocrystalline Si were respectively etched by immersion in a 1:5 mixture of 49% hydrofluoric acid and aqueous 30% hydrogen peroxide solution with stirring. The porous Si was prepared by anodization of monocrystalline Si under the conditions below. The starting material for the porous Si to be formed by the anodization is not limited to monocrystalline Si but any other crystal structure of Si may be employed.

| | |
|---|---|
| Applied voltage: | 2.6 V |
| Current density: | 30 mA · cm$^{-2}$ |
| Anodization solution: | HF:H$_2$O:C$_2$H$_5$OH = 1:1:1 |
| Time: | 2.4 hours |
| Porous Si thickness: | 300 µm |
| Porosity: | 56% |

The porous Si prepared under the above conditions was etched by immersion in a 1:5 mixture of 49% hydrofluoric acid and aqueous 30% hydrogen peroxide solution at room temperature without stirring. The decrease of the thickness of the porous Si was measured later. The progress of the etching is shown by blank circles (o). The porous Si was etched rapidly (112 µm in 40 minutes and 256 µm in 80 minutes) uniformly with retention of satisfactory surface property. The etching rate depends on the solution concentration and the temperature.

Separately, nonporous Si of 500 µm thick was etched by immersion in the 1:5 mixture of 49% hydrofluoric acid and aqueous 30% hydrogen peroxide solution at room temperature with stirring. The decrease of the thickness was measured later. The progress of the etching is shown by solid circles (o). The nonporous Si was etched by not more than 50 Å even after 80 minutes of etching.

The addition of the aqueous hydrogen peroxide solution accelerates the oxidation of silicon, and thereby increases the reaction velocity in comparison with the case of absence of hydrogen peroxide. Further the reaction velocity can be controlled by changing the ratio of the hydrogen peroxide solution.

After the etching, the porous Si and the nonporous Si were washed with water. The surfaces were observed by secondary ion mass spectrometry to detect no impurity.

The conditions of the solution concentration and the temperature are decided within the range that the etching rate of the porous Si and the selectivity of the etching of the porous Si relative to nonporous Si are allowable in the production process, and the effect of the alcohol is achievable.

Figure 11:
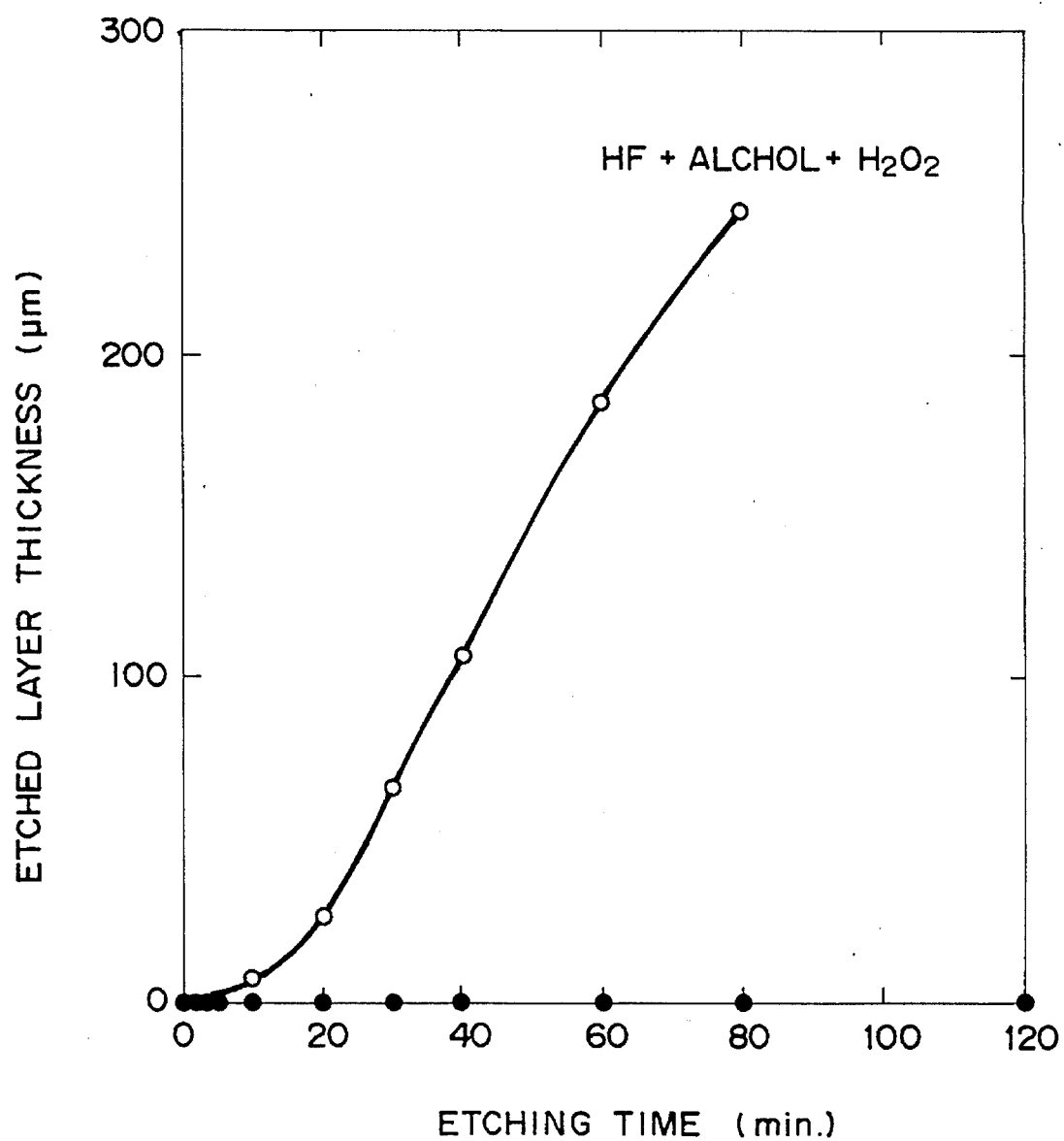
FIG. 11 is a graph showing the etching characteristics of porous Si and nonporous Si in etching with a mixture of hydrofluoric acid, alcohol, and aqueous hydrogen peroxide.
Figure 13A:
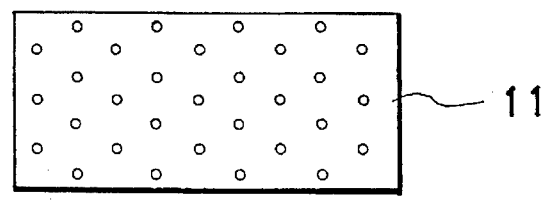
FIGS. 13A to 13E are schematic views for explaining one example of the production process of the present invention.
Figure 13B:
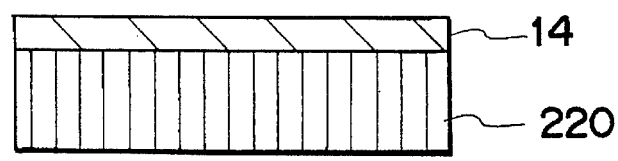
Figure 13C:
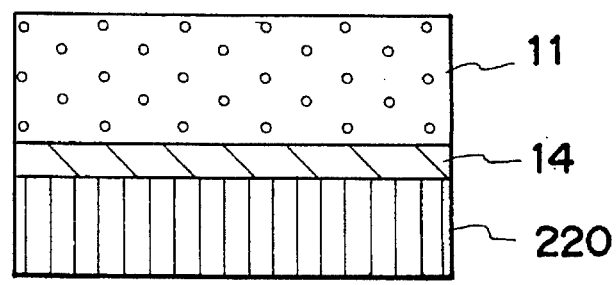
Figure 13D:
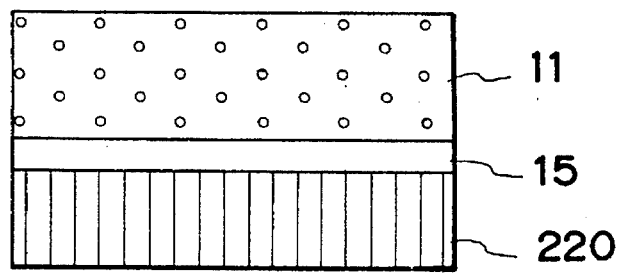
Figure 13E:
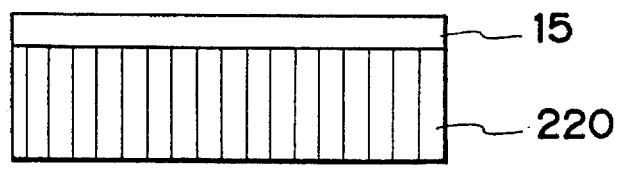

FIG. 11 shows the dependency of the etched layer thicknesses (thickness decreases) of porous Si and monocrystalline Si on etching time in the case where the porous Si and monocrystalline Si were respectively etched by immersion in a 10:6:50 mixture of 49% hydrofluoric acid, alcohol and aqueous 30% hydrogen peroxide solution without stirring. The porous Si was prepared by anodization of monocrystalline Si under the conditions below. The starting material for the porous Si to be formed by the anodization is not limited to monocrystalline Si but any other crystal structure of Si may be employed.

| | |
|---|---|
| Applied voltage: | 2.6 V |
| Current density: | 30 mA · cm$^{-2}$ |
| Anodization solution: | HF:H$_2$O:C$_2$H$_5$OH = 1:1:1 |
| Time: | 2.4 hours |
| Porous Si thickness: | 300 µm |
| Porosity: | 56% |

The porous Si prepared under the above conditions was etched by immersion in a 10:6:50 mixture of 49% hydrofluoric acid, alcohol and aqueous 30% hydrogen peroxide solution at room temperature without stirring. The decrease of the thickness of the porous Si was measured later. The progress of the etching is shown by blank circles (o). The porous Si was etched rapidly (107 µm in 40 minutes and 244 µm in 80 minutes) uniformly with retention of satisfactory surface property. The etching rate depends on the concentration of the solution and the temperature.

Separately, nonporous Si of 500 µm thick was etched by immersion in the 10:6:50 mixture of 49% hydrofluoric acid, alcohol and aqueous 30% hydrogen peroxide solution at room temperature without stirring. The decrease of the thickness was measured later. The progress of the etching is shown by solid circles (●). The nonporous Si was etched by not more than 50 Å even after 80 minutes of etching.

The addition of the aqueous hydrogen peroxide solution accelerates the oxidation of silicon, and thereby increases the reaction velocity in comparison with the case of absence of hydrogen peroxide. Further the reaction velocity can be controlled by changing the ratio of the hydrogen peroxide solution.

The addition of alcohol allows the instantaneous removal of bubbles formed by the etching reaction from the etched surface without stirring, thus enabling uniform and effective etching of the porous Si.

After the etching, the porous Si and the nonporous Si were washed with water. The surfaces were observed by secondary ion mass spectrometry to detect no impurity.

The conditions of the solution concentration and the temperature are decided within the range that the etching rate of the porous Si and the selectivity of the etching of the porous Si relative to nonporous Si are allowable in the production process, and the effect of the alcohol is achievable.

Embodiment 2

Figure 2A:
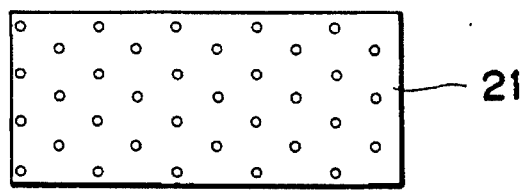
FIGS. 2A to 2F are schematic views for explaining one example of the production process of the present invention.
Figure 2B:
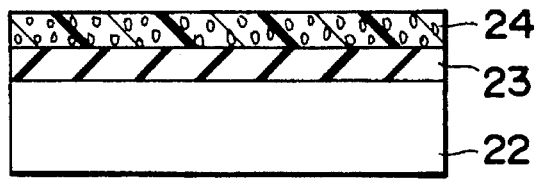
Figure 2C:
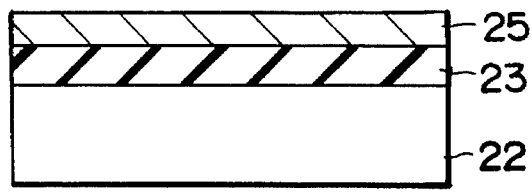
Figure 2D:
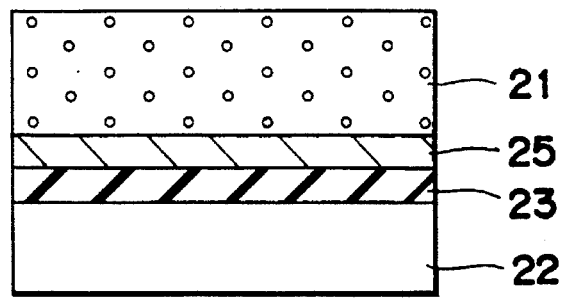
Figure 2E:
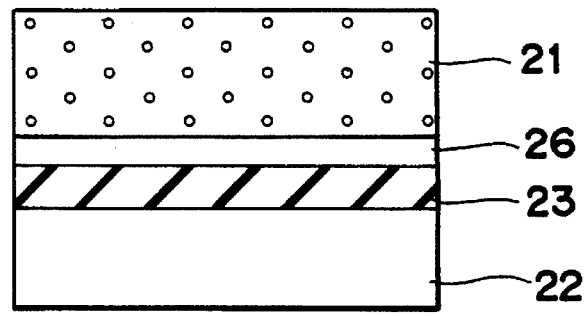
Figure 2F:
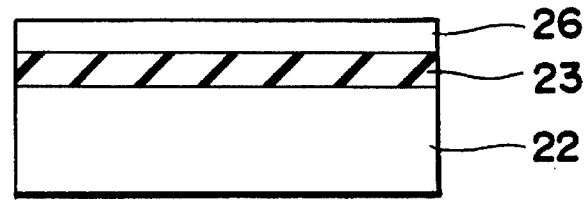

This Embodiment is different from the above Embodiment 1 in that on an Si substrate 22 as a second substrate member, an insulating layer 23 is formed, and further thereon a polycrystalline Si layer 24 is formed as shown in FIG. 2B, and subsequently the polycrystalline Si layer 24 is transformed into an amorphous layer 25 by ion implantation as shown in FIG. 2C.

Embodiment 3

The surface portion of a monocrystalline Si substrate 31 as a first substrate member is made porous to form a porous layer 32 as shown in FIG. 3A. On a second substrate member 33, an insulating layer 34 and further thereon an amorphous Si layer 35 are formed as shown in FIG. 3B. The inside wall of the pores of the porous layer 32 are allowed to be oxidized by spontaneous oxidation, oxidation with chemical in washing, thermal oxidation, etc.

The porous layer 32 on the first substrate member and the amorphous layer 35 on the second substrate are bonded together as shown in FIG. 3C. The bonded article is heat-treated at a temperature lower than the crystallization temperature of the amorphous Si to bond tightly the face of the porous Si 32 and the face of the amorphous Si 35.

The bonded substrate members are further heat-treated to form a monocrystalline Si layer 36 from the amorphous Si layer 35 by solid epitaxial growth by utilizing the porous Si layer 32 as the crystal growth seed as shown in FIG. 3D.

Then the monocrystalline Si substrate 31 is removed by abrading and polishing to the extent that the porous Si layer 32 is just unexposed (FIG. 3E), and the remaining monocrystalline substrate 31 is removed by etching by utilizing the porous Si layer 32 as the etch-stop layer (first selective etching, FIG. 3F). In this first selective etching, as an etching solution which etches Si more rapidly than $SiO_2$, the etchant such as hydrofluoric nitric acid type etchants, a mixture of ethylenediamine, pyrocatechol and water, and KOH type etchants is used.

The bonded substrate members in the step of FIG. 3F are chemically etched to remove the porous Si layer 32 (second selective etching), leaving the thin monocrystalline Si layer 36 on the insulating layer 34 (FIG. 3G).

Embodiment 4

Figure 14A:
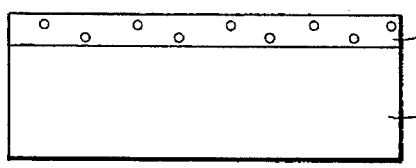
FIGS. 14A to 14G are schematic views for explaining one example of the production process of the present invention.
Figure 14B:
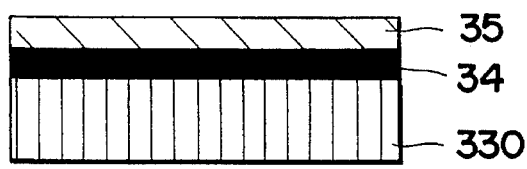

The surface portion of a monocrystalline Si substrate 31 as a first substrate member was made porous to form a porous layer 32 as shown in FIG. 14A. On a second substrate member 330, an insulating layer 34 and further thereon an amorphous Si layer 35 are formed as shown in FIG. 14B. The inside wall of the pores of the porous layer 32 are allowed to be oxidized by spontaneous oxidation, oxidation with a washing chemical, thermal oxidation, etc.

Figure 14C:
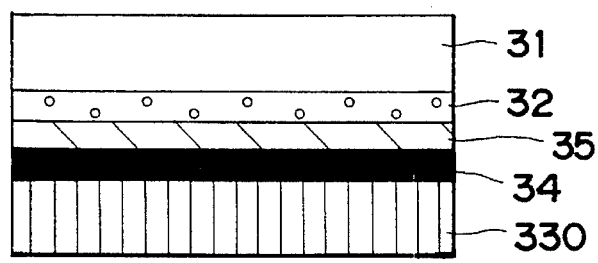

The porous layer 32 on the first substrate member and the amorphous layer 35 on the second substrate are bonded together as shown in FIG. 14C. The bonded article is heat-treated at a temperature lower than the crystallization temperature of the amorphous Si to bond tightly the face of the porous Si 32 and the face of the amorphous Si 35.

Figure 14D:
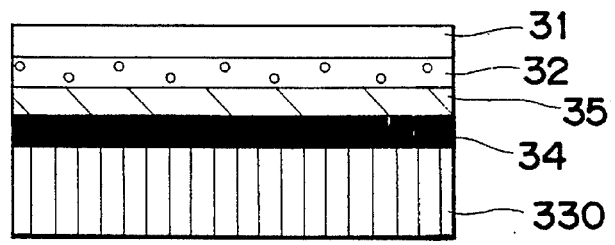

Then the monocrystalline Si substrate 31 is removed by abrading and polishing to the extent that the porous Si layer 32 is just unexposed (FIG. 14D).

Figure 14E:
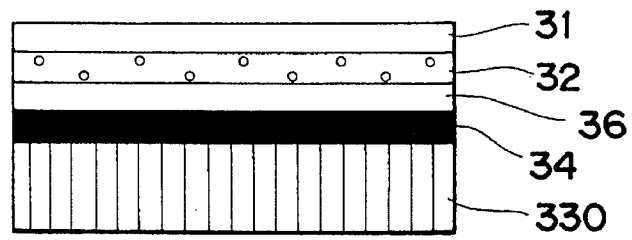

The bonded article is further heat-treated to form a monocrystalline Si layer 36 from the amorphous Si layer 35 by solid-phase epitaxial growth by utilizing the porous Si layer 32 as the crystal growth seed as shown in FIG. 14E.

Figure 14F:
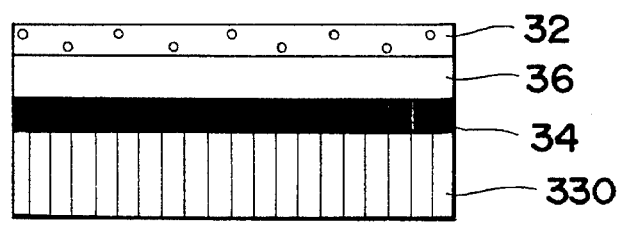

The remaining monocrystalline substrate 31 is removed by etching by utilizing the porous Si layer 32 as the etch-stop layer (first selective etching, FIG. 14F). In this first selective etching, as an etching solution which etches Si more rapidly than $SiO_2$, the etchant such as hydrofluoric nitric acid type etchants, a mixture of ethylenediamine, pyrocatechol, and water, and KOH type etchants is used.

Figure 14G:
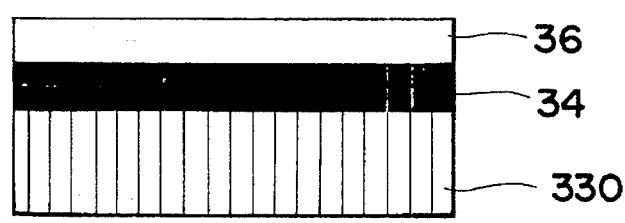
Figure 15A:
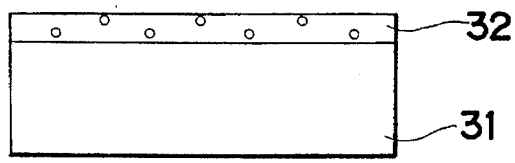
FIGS. 15A to 15G are schematic views for explaining one example of the production process of the present invention.
Figure 15B:
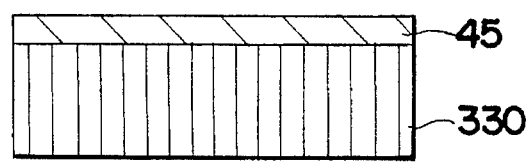
Figure 15C:
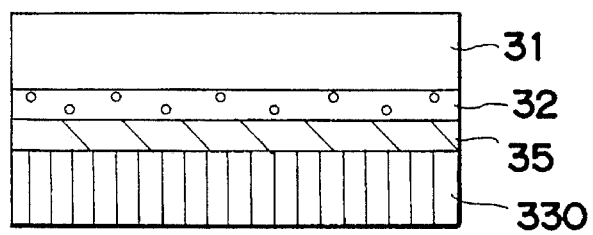
Figure 15D:
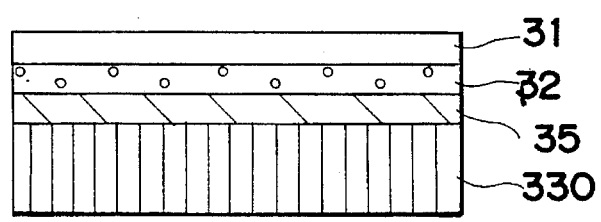
Figure 15E:
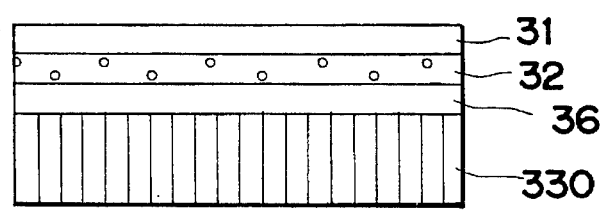
Figure 15F:
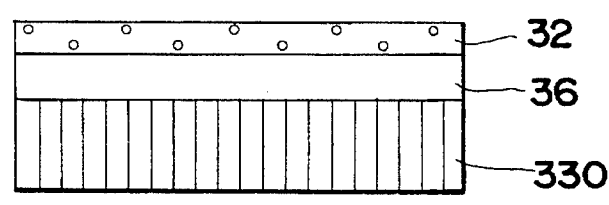
Figure 15G:
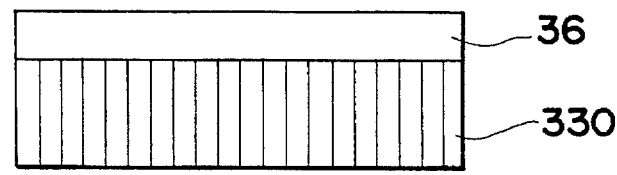

The bonded substrates in the step of FIG. 14F are chemically etched to remove the porous Si layer 32 (second selective etching), leaving the thin monocrystalline Si layer 36 on the insulating layer 34 (FIG. 14G).

In the embodiment in FIGS. 15A to 15G, no insulating layer is formed on the second substrate 430.

The solid-phase epitaxial growth mentioned above may be conducted after the first selective etching.

The present invention will be described below in detail referring to the Examples.

In the description below, the Examples correspond respectively to any one of the above embodiments.

Example 1

To make porous a first substrate member, a monocrystalline Si substrate was anodized which has a thickness of 200 μm, a resistivity of 0.01 Ω·cm, and crystal orientation (100), and was of P-type or N-type. The anodization conditions were as below.

| | |
|---|---|
| Applied voltage: | 2.6 V |
| Current density: | 30 mA · $cm^{-2}$ |

| | |
|---|---|
| Anodization solution: | $HF:H_2O:C_2H_5OH = 1:1:1$ |
| Time: | 1.6 hours |
| Porous Si thickness: | 200 μm |
| Porosity: | 56% |

Separately, on an Si substrate as a second substrate, an $SiO_2$ layer of 500 nm thick was formed by thermal oxidation, and further thereon an amorphous Si layer was deposited in a thickness of 0.1 μm by thermal CVD under the deposition conditions below.

| | |
|---|---|
| Source gas: | $SiH_4$ |
| Gas pressure: | 0.3 Torr |
| Gas flow rate: | 50 ccm |
| Temperature: | 550° C. |
| Growth rate: | 1.8 nm/min |

The surface of the porous Si and the surface of the amorphous Si were brought into close contact, the contacted article was heat-treated for 30 minutes at a temperature of atmosphere of 500° C. which is lower than the crystallization temperature of the amorphous Si to complete the bonding.

The bonded substrate members were heat-treated at 600° C. for one hour so as to grow the amorphous Si by utilizing the porous Si as the crystal growth seed by solid-phase epitaxial growth. Thereby the amorphous Si layer entirely grew epitaxially in solid phase to form a monocrystalline Si film.

The bonded substrate members were etched by immersion in a hydrofluoric acid-nitric acid-acetic acid (1:3:8) solution. The etching rate of the porous Si was about 100 times that of the monocrystalline Si owing to the reduced density by half and other reasons. The rate of etching of normal monocrystalline Si by the hydrofluoric acid-nitric acid-acetic acid (1:3:8) solution is 1 μm or a little less per minute. Therefore the porous Si region of 200 μm thick was removed in 2 minutes. Consequently, the porous Si substrate of 200 μm thick was removed, leaving a monocrystalline Si layer of 0.1 μm thick on the insulating substrate.

The monocrystalline Si layer was found to have high crystallinity by observation of cross-section by transmission electron microscopy.

Example 2

The same experiment was conducted as in Example 1 except for the conditions described below.

In this Example, the solid-phase epitaxial growth was conducted at 1000° C. for 5 minutes, while in Example 1 the heat treatment was conducted at 600° C. for one hour. The etching of the porous Si of the bonded substrates was conducted in 7M NaOH solution. The porous Si region of 200 μm thick was removed in 2 minutes since the porous Si is etched more quickly than the monocrystalline Si and etching rate of the monocrystalline Si by 7M NaOH is 1 μm or a little less per minute. Other conditions such as the anodization conditions, and the amorphous Si deposition conditions, and the effects are the same as in Example 1. Therefore the description thereof is omitted here.

Example 3

The same experiment was conducted as in Example 1 except for the conditions described below.

The amorphous Si was treated at 1200° C. for one minute according to RTA (rapid thermal annealing) method for solid-phase epitaxial growth thereof by utilizing the porous Si as the crystal growth seed. The bonded substrates were etched with 6M KOH solution. Thereby the porous Si region of 200 μm thick was removed in 2 minutes since the porous Si is etched more quickly than the monocrystalline Si and etching rate of the monocrystalline Si by 6M KOH is 1 μm or a little less per minute. Other conditions are the same as in Example 1, so that the description thereof is omitted here.

Example 4

The same experiment was conducted as in Example 1 except for the conditions described below.

In the deposition of the amorphous Si layer, an $SiO_2$ layer of 500 nm thick was formed by thermal oxidation of the Si substrate, and further thereon an amorphous Si layer was deposited in a thickness of 0.1 μm by plasma CVD under the deposition conditions below.

| | |
|---|---|
| Source gas: | $SiH_4$ |
| Gas pressure: | 0.3 Torr |
| Gas flow rate: | 10 ccm |
| Temperature: | 350° C. |
| Growth rate: | 1.8 nm/min |
| Power: | 5 W |

The heat treatment for the solid-phase epitaxial growth was conducted at 1000° C. for 5 minutes. Other conditions are the same as in Example 1, and are omitted here.

Example 5

The same experiment was conducted as in Example 1 except for the conditions described below.

In the deposition of the amorphous Si layer, an $SiO_2$ layer of 500 nm thick was formed by thermal oxidation of the Si substrate, and further on the $SiO_2$ an amorphous Si layer was deposited in a thickness of 0.2 μm by vapor deposition under the deposition conditions below.

| | |
|---|---|
| Temperature: | 200° C. |
| Pressure: | $1 \times 10^{-9}$ Torr |
| Growth rate: | 0.1 nm/sec |

The heat treatment after contact of the surface of the porous Si with the surface of the amorphous Si was conducted for 30 minutes in an atmosphere of 500° C. which is lower than the crystallization temperature of the amorphous Si, and the subsequent heat treatment was conducted in an atmosphere of 600° C. for 2 hours for solid-phase epitaxial growth of the amorphous Si by utilizing the porous Si as the crystal growth seed. The thickness of the monocrystalline Si formed on the insulating layer was 0.2 μm. Other conditions were the same as in Example 1, and are omitted here.

Example 6

In this Example, instead of directly forming an amorphous Si layer on an insulating layer on an Si substrate as the second substrate member, polycrystalline Si was deposited and then it was made amorphous. In more detail, a monocrystalline Si substrate as a first substrate was made porous by anodization under the same conditions in Example 1. On the other hand, another Si substrate as a second substrate member was thermally oxidized to form thereon an $SiO_2$ layer of 500 nm thick, and further thereon a polycrystalline Si layer was deposited in a thickness of 0.1 μm by thermal CVD under the deposition conditions below:

| | |
|---|---|
| Source gas: | $SiH_4$ |
| Gas pressure: | 0.3 Torr |
| Gas flow rate: | 50 ccm |
| Temperature: | 620° C. |
| Growth rate: | 10 nm/min |

Then the polycrystalline Si layer was made completely amorphous by implantation of Si ion under the ion implantation conditions below:

| | |
|---|---|
| $Si^+$ acceleration voltage: | 40 keV |
| Amount of implanted ion: | $5 \times 10^{15}$ cm$^{-2}$ |

The surface of the porous Si and the surface of the amorphous Si were brought into contact, and the contacted article was heat-treated for 30 minutes at a temperature of 500° C. which is lower than the crystallization temperature of the amorphous Si to complete the bonding.

The bonded substrate members were heat-treated at 600° C. for one hour so as to grow the amorphous Si by utilizing the porous Si as the crystal growth seed by solid-phase epitaxial growth. Thereby the amorphous Si layer entirely grew epitaxially in solid phase to form a monocrystalline Si film.

The bonded substrate members were etched in 7M NaOH solution. The etching rate of the porous Si was about 100 times that of the monocrystalline Si as mentioned before, and the rate of etching of normal monocrystalline Si by 7M NaOH solution is 1 μm or a little less per minute. Therefore the porous Si region of 200 μm thick was removed in 2 minutes. Consequently, the porous Si substrate of 200 μm thick was removed, leaving monocrystalline Si layer of 0.1 μm thick on the insulating substrate.

The monocrystalline Si layer was found to have high crystallinity by observation of the cross-section by transmission electron microscopy.

Example 7

In this Example, the bonded substrate members in Example 6 were etched by immersion in 6M KOH solution. The etching rate of the porous Si was about 100 times that of the monocrystalline Si as mentioned before, and the rate of etching of normal monocrystalline Si by 6M KOH solution is 1 μm or a little less per minute. Therefore the porous Si region of 200 μm thick was removed in 2 minutes. Other conditions are the same as in Example 6, and are omitted here.

Example 8

In this Example, the deposition of amorphous Si on the insulating layer in Example 1 was conducted such that an $SiO_2$ layer of 500 nm thick was formed on the Si substrate as the second substrate member by atmospheric pressure CVD. Further on the $SiO_2$, an amorphous Si layer was deposited in a thickness of 0.2 μm by thermal CVD under the deposition conditions below:

| | |
|---|---|
| Source gas: | $Si_2H_6$ |
| Gas pressure: | 0.3 Torr |

| | |
|---|---|
| Temperature: | 550° C. |

Other experimental conditions were the same as in Example 1.

Example 9

In this Example, not all the Si substrate as the first substrate member, but a surface layer portion thereof was made porous.

A P-type or N-type monocrystalline Si substrate was anodized which has a diameter of 6 inches, a thickness of 625 μm, a resistivity of 0.01 Ω·cm, and crystal orientation (100). The anodization condition was as below.

| | |
|---|---|
| Current density: | 5 mA·cm$^{-2}$ |
| Anodization solution: | HF:H$_2$O:C$_2$H$_5$OH = 1:1:1 |
| Time: | 12 minutes |
| Porous Si thickness: | 10 μm |
| Porosity: | 45% |

This substrate was allowed to be oxidized in an oxygen atmosphere at 400° C. for one hour, whereby the inside walls of the pores of the porous Si were covered with a thermal oxidation film.

Another Si substrate as a second substrate member was thermally oxidized to form thereon an SiO$_2$ layer of 500 nm thick, and further thereon a amorphous Si layer was deposited in a thickness of 0.1 μm by thermal CVD under the deposition conditions below:

| | |
|---|---|
| Source gas: | SiH$_4$ |
| Gas pressure: | 0.3 Torr |
| Gas flow rate: | 50 ccm |
| Temperature: | 550° C. |
| Growth rate: | 1.8 nm/min |

Then to the amorphous Si, Si ion was implanted under the conditions below:

| | |
|---|---|
| Acceleration voltage: | 70 keV |
| Amount of implanted ion: | 4 × 10$^{14}$ cm$^{-2}$ |

The ion implantation inhibited nucleus generation at the Si/SiO$_2$ interface.

The surface of the porous Si and the surface of the amorphous Si were brought into contact, and the contacted article was heat-treated for 30 minutes at a temperature of 500° C. which is lower than the crystallization temperature of the amorphous Si to complete the bonding.

The bonded article was heat-treated at 600° C. for 2 hours so as to grow the amorphous Si by utilizing the porous Si as the crystal growth seed by solid-phase epitaxial growth. Thereby the amorphous Si layer entirely grew epitaxially in solid phase to form a monocrystalline Si film.

Most of the first Si substrate was removed by grinding and polishing to leave a 10 μm-thick layer thereof remaining, and then this remaining 10 μm-thick monocrystalline Si substrate was selectively etched with a solution of "1HF+20HNO$_3$+20CH$_3$COOH" by utilizing the porous Si layer having pores oxidized at the internal walls as an etch-stop layer. The entire of the first Si substrate was etched in 10 minutes, whereby the porous Si layer came to be exposed.

The bonded substrates were etched by immersion in a hydrofluoric acid-nitric acid-acetic acid (1:3:8) solution. The etching rate of the porous Si was about 100 times that of the monocrystalline Si as mentioned before. The rate of etching of normal monocrystalline Si in the hydrofluoric acid-nitric acid-acetic acid (1:3:8) solution is 1 μm or a little less per minute. Therefore the porous Si region of 10 μm thick was removed in 0.1 minute.

Consequently, the Si substrate of 625 μm thick was removed, leaving monocrystalline Si layer of 0.1 μm thick on the insulating substrate. The selective etching of the porous Si caused no change in the monocrystalline Si layer.

The monocrystalline Si layer was found to have high crystallinity by observation of cross-section by transmission electron microscopy.

Example 10

This Example is different from Example 1 in the etching treatment after the monocrystalline Si layer was formed by solid-phase epitaxial growth.

The bonded substrates were subjected to selective etching with a 10:6:50 mixture of buffered hydrofluoric acid (NH$_4$F: 36%, HF: 4.5%), alcohol and aqueous 30% hydrogen peroxide solution without stirring. In 205 minutes, the porous Si substrate was selectively removed completely with the monocrystalline Si left unetched as an etch-stop material.

The rate of etching of the nonporous monocrystalline Si by the above etching solution is extremely low: about 50 Å or less for 205 minutes. Therefore, the etching selectivity ratio of the porous Si to the nonporous Si is 10$^5$ or more, so that the layer thickness decrease of the nonporous layer (several tens of Å) by etching was practically negligible.

Example 11

This Example is different from Example 2 in the etching treatment after the monocrystalline Si layer was formed by solid-phase epitaxial growth.

The bonded substrates were subjected to selective etching with a 1:5 mixture of buffered hydrofluoric acid (NH$_4$F: 36%, HF: 4.5%) and aqueous 30% hydrogen peroxide solution with stirring. In 191 minutes, the porous Si substrate was selectively removed completely with the monocrystalline Si left unetched as an etch-stop material.

The rate of etching of the nonporous monocrystalline Si by the above etching solution is extremely low: about 50 Å or less for 191 minutes. Therefore, the etching selectivity ratio of the porous Si to the nonporous Si is 10$^5$ or more, so that the layer thickness decrease of the nonporous layer (several tens of Å) by etching was practically negligible.

Example 12

This Example is different from Example 3 in the etching treatment after the monocrystalline Si layer was formed by solid-phase epitaxial growth.

The bonded substrates were subjected to selective etching with a 10:1 mixture of buffered hydrofluoric acid (NH$_4$F: 36%, HF: 4.5%) and alcohol without stirring. In 275 minutes, the porous Si substrate was selectively removed completely with the monocrystalline Si left unetched as an etch-stop material.

The rate of etching of the nonporous monocrystalline Si by the above etching solution is extremely low: about 50 Å or less for 275 minutes. Therefore, the etching selectivity ratio of the porous Si to the nonporous Si is 10$^5$ or more, so that the layer thickness decrease of the nonporous layer (several tens of Å) by etching was practically negligible.

Example 13

This Example is different from Example 4 in the etching treatment after the monocrystalline Si layer was formed by solid-phase epitaxial growth.

The bonded substrates were subjected to selective etching with buffered hydrofluoric acid ($NH_4F$: 36%, HF: 4.5%) with stirring. In 258 minutes, the porous Si substrate was selectively removed completely with the monocrystalline Si left unetched as an etch-stop material.

The rate of etching of the nonporous monocrystalline Si by the above etching solution is extremely low: about 50 Å or less for 258 minutes. Therefore, the etching selectivity ratio of the porous Si to the nonporous Si is $10^5$ or more, so that the layer thickness decrease of the nonporous layer (several tens of Å) by etching was practically negligible.

Example 14

This Example is different from Example 5 in the etching treatment after the monocrystalline Si layer was formed by solid-phase epitaxial growth.

The bonded substrates were subjected to selective etching with a 10:6:50 mixture of buffered hydrofluoric acid ($NH_4F$: 36%, HF: 4.5%), alcohol and aqueous 30% hydrogen peroxide solution without stirring. In 205 minutes, the porous Si substrate was selectively removed completely with the monocrystalline Si left unetched as an etch-stop material.

The rate of etching of the nonporous monocrystalline Si by the above etching solution is extremely low: about 50 Å or less for 205 minutes. Therefore, the etching selectivity ratio of the porous Si to the nonporous Si is $10^5$ or more, so that the layer thickness decrease of the nonporous layer (several tens of Å) by etching was is practically negligible.

Example 15

This Example is different from Example 6 in the etching treatment after the monocrystalline Si layer was formed by solid-phase epitaxial growth.

The bonded substrates were subjected to selective etching with a 1:5 mixture of buffered hydrofluoric acid ($NH_4F$: 36%, HF: 4.5%) and aqueous 30% hydrogen peroxide solution with stirring. In 191 minutes, the porous Si substrate was selectively removed completely with the monocrystalline Si left unetched as an etch-stop material.

The rate of etching of the nonporous monocrystalline Si by the above etching solution is extremely low: about 50 Å or less for 191 minutes. Therefore, the etching selectivity ratio of the porous Si to the nonporous Si is $10^5$ or more, so that the layer thickness decrease of the nonporous layer (several tens of Å) by etching was practically negligible.

Example 16

This Example is different from Example 7 in the etching treatment after the monocrystalline Si layer was formed by solid-phase epitaxial growth.

The bonded substrates were subjected to selective etching with a 10:1 mixture of buffered hydrofluoric acid ($NH_4F$: 36%, HF: 4.5%) and alcohol without stirring. In 275 minutes, the porous Si substrate was selectively removed completely with the monocrystalline Si left unetched as an etch-stop material.

The rate of etching of the nonporous monocrystalline Si by the above etching solution is extremely low: about 50 Å or less for 275 minutes. Therefore, the etching selectivity ratio of the porous Si to the nonporous Si is $10^5$ or more, so that the layer thickness decrease of the nonporous layer (several tens of Å) by etching was practically negligible.

Example 17

This Example is different from Example 8 in the etching treatment after the monocrystalline Si layer was formed by solid-phase epitaxial growth.

The bonded substrates were subjected to selective etching with buffered hydrofluoric acid ($NH_4F$: 36%, HF: 4.5%) with stirring. In 258 minutes, the porous Si substrate was selectively removed completely with the monocrystalline Si left unetched as an etch-stop material.

The rate of etching of the nonporous monocrystalline Si by the above etching solution is extremely low: about 50 Å or less for 258 minutes. Therefore, the etching selectivity ratio of the porous Si to the nonporous Si is $10^5$ or more, so that the layer thickness decrease of the nonporous layer (several tens of Å) by etching was practically negligible.

Example 18

This Example is different from Example 9 in the etching treatment after the monocrystalline Si layer was formed by solid-phase epitaxial growth.

The porous Si layer was selectively etched with a 1:5 mixture of buffered hydrofluoric acid ($NH_4F$: 36%, HF: 4.5%) and aqueous 30% hydrogen peroxide solution with stirring. In one minute, the porous Si substrate was selectively removed completely with the monocrystalline Si left unetched as an etch-stop material.

The rate of etching of the nonporous monocrystalline Si by the above etching solution is extremely low: about 50 Å or less per minute. Therefore, the etching selectivity ratio of the porous Si to the nonporous Si is $10^5$ or more, so that the layer thickness decrease of the nonporous layer (several tens of Å) by etching was practically negligible.

Example 19

This Example is different from Example 1 in the etching treatment after the monocrystalline Si layer was formed by solid-phase epitaxial growth.

The bonded substrates were subjected to selective etching with a 10:6:50 mixture of 49% hydrofluoric acid, alcohol and aqueous 30% hydrogen peroxide solution without stirring. In 65 minutes, the porous Si substrate was selectively removed completely with the monocrystalline Si left unetched as an etch-stop material.

The rate of etching of the nonporous monocrystalline Si by the above etching solution is extremely low: about 50 Å or less for 65 minutes. Therefore, the etching selectivity ratio of the porous Si to the nonporous Si is $10^5$ or more, so that the layer thickness decrease of the nonporous layer (several tens of Å) by etching was practically negligible.

Example 20

This Example is different from Example 2 in the etching treatment after the monocrystalline Si layer was formed by solid-phase epitaxial growth.

The bonded substrates were subjected to selective etching with a 1:5 mixture of 49% hydrofluoric acid and aqueous 30% hydrogen peroxide solution with stirring. In 62 minutes, the porous Si substrate was selectively removed completely with the monocrystalline Si left unetched as an etch-stop material.

The rate of etching of the nonporous monocrystalline Si by the above etching solution is extremely low: about 50 Å or less for 62 minutes. Therefore, the etching selectivity ratio of the porous Si to the nonporous Si is $10^5$ or more, so that the layer thickness decrease of the nonporous layer (several tens of Å) by etching was is practically negligible.

Example 21

This Example is different from Example 3 in the etching treatment after the monocrystalline Si layer was formed by solid-phase epitaxial growth.

The bonded substrates were subjected to selective etching with a 10:1 mixture of 49% hydrofluoric acid and alcohol without stirring. In 82 minutes, the porous Si substrate was selectively removed completely with the monocrystalline Si left unetched as an etch-stop material.

The rate of etching of the nonporous monocrystalline Si by the above etching solution is extremely low: about 50 Å or less for 82 minutes. Therefore, the etching selectivity ratio of the porous Si to the nonporous Si is $10^5$ or more, so that the layer thickness decrease of the nonporous layer (several tens of Å) by etching was is practically negligible.

Example 22

This Example is different from Example 4 in the etching treatment after the monocrystalline Si layer was formed by solid-phase epitaxial growth.

The bonded substrates were subjected to selective etching with 49% hydrofluoric acid with stirring. In 78 minutes, the porous Si substrate was selectively removed completely with the monocrystalline Si left unetched as an etch-stop material.

The rate of etching of the nonporous monocrystalline Si by the above etching solution is extremely low: about 50 Å or less for 78 minutes. Therefore, the etching selectivity ratio of the porous Si to the nonporous Si is $10^5$ or more, so that the layer thickness decrease of the nonporous layer (several tens of Å) by etching was practically negligible.

Example 23

This Example is different from Example 5 in the etching treatment after the monocrystalline Si layer was formed by solid-phase epitaxial growth.

The bonded substrates were subjected to selective etching with a 10:6:50 mixture of 49% hydrofluoric acid, alcohol and aqueous 30% hydrogen peroxide solution without stirring. In 65 minutes, the porous Si substrate was selectively removed completely with the monocrystalline Si left unetched as an etch-stop material.

The rate of etching of the nonporous monocrystalline Si by the above etching solution is extremely low: about 50 Å or less for 65 minutes. Therefore, the etching selectivity ratio of the porous Si to the nonporous Si is $10^5$ or more, so that the layer thickness decrease of the nonporous layer (several tens of Å) by etching was practically negligible.

Example 24

This Example is different from Example 6 in the etching treatment after the monocrystalline Si layer was formed by solid-phase epitaxial growth.

The bonded substrates were subjected to selective etching with a 1:5 mixture of 49% hydrofluoric acid and aqueous 30% hydrogen peroxide solution with stirring. In 62 minutes, the porous Si substrate was selectively removed completely with the monocrystalline Si left unetched as an etch-stop material.

The rate of etching of the nonporous monocrystalline Si by the above etching solution is extremely low: about 50 Å or less for 62 minutes. Therefore, the etching selectivity ratio of the porous Si to the nonporous Si is $10^5$ or more, so that the layer thickness decrease of the nonporous layer (several tens of Å) by etching was practically negligible.

Example 25

This Example is different from Example 7 in the etching treatment after the monocrystalline Si layer was formed by solid-phase epitaxial growth.

The bonded substrates were subjected to selective etching with a 10:1 mixture of 49% hydrofluoric acid and alcohol without stirring. In 82 minutes, the porous Si substrate was selectively removed completely with the monocrystalline Si left unetched as an etch-stop material.

The rate of etching of the nonporous monocrystalline Si by the above etching solution is extremely low: about 50 Å or less for 82 minutes. Therefore, the etching selectivity ratio of the porous Si to the nonporous Si is $10^5$ or more, so that the layer thickness decrease of the nonporous layer (several tens of Å) by etching was practically negligible.

Example 26

This Example is different from Example 8 in the etching treatment after the monocrystalline Si layer was formed by solid-phase epitaxial growth.

The bonded substrates were subjected to selective etching with 49% hydrofluoric acid with stirring. In 78 minutes, the porous Si substrate was selectively removed completely with the monocrystalline Si left unetched as an etch-stop material.

The rate of etching of the nonporous monocrystalline Si by the above etching solution is extremely low: about 50 Å or less for 78 minutes. Therefore, the etching selectivity ratio of the porous Si to the nonporous Si is $10^5$ or more, so that the layer thickness decrease of the nonporous layer (several tens of Å) by etching was practically negligible.

Example 27

This Example is different from Example 9 in the etching treatment after the monocrystalline Si layer was formed by solid-phase epitaxial growth.

The bonded substrates were subjected to selective etching with a 1:5 mixture of 49% hydrofluoric acid and aqueous 30% hydrogen peroxide solution with stirring. In 16.1 minutes, the porous Si substrate was selectively removed completely with the monocrystalline Si left unetched as an etch-stop material.

The rate of etching of the nonporous monocrystalline Si by the above etching solution is extremely low: about 50 Å or less for 16.1 minutes. Therefore, the etching selectivity ratio of the porous Si to the nonporous Si is $10^5$ or more, so that the layer thickness decrease of the nonporous layer (several tens of Å) by etching was practically negligible.

Example 28

In this Example and later Examples, the materials of the first substrate member and the second substrate member are different from each other.

In this Example, a P-type or N-type (100) monocrystalline Si substrate having a thickness of 200 μm and resistivity of 0.01 Ω·cm was employed as the first substrate member, and was anodized in an HF solution under the anodization conditions below:

| | |
|---|---|
| Current density: | 30 mA · cm$^{-2}$ |
| Anodization solution: | HF:H$_2$O:C$_2$H$_5$OH = 1:1:1 |
| Time: | 1.6 hours |
| Porous Si thickness: | 200 μm |
| Porosity: | 56% |

On a fused silica substrate as the second substrate member, a CVD-SiO$_2$ layer of 500 nm thick was formed, and further on the formed SiO$_2$ layer, amorphous Si layer was deposited in a thickness of 0.1 μm by thermal CVD under the deposition conditions below:

| | |
|---|---|
| Source gas: | SiH$_4$ |
| Gas pressure: | 0.3 Torr |
| Gas flow rate: | 50 ccm |
| Temperature: | 550° C. |
| Growth rate: | 1.8 nm/min |

The surface of the porous Si and the surface of the amorphous Si were brought together into close contact, and the contacted article was heat-treated for minutes at a temperature of 500° C. which is lower than the crystallization temperature of the amorphous Si to complete the bonding.

The bonded article was heat-treated at 600° C. for one hour so as to grow the amorphous Si by utilizing the porous Si as the crystal growth seed by solid-phase epitaxial growth. Thereby the amorphous Si layer entirely grew epitaxially in a solid phase to form a monocrystalline Si film.

Then only on the fused silica side, an Si$_3$N$_4$ film was formed as an etching protection film, and the bonded article was selectively etched by immersion in a 10:6:50 mixture of 49% hydrofluoric acid, alcohol and aqueous 30% hydrogen peroxide solution without stirring. In 65 minutes, the porous Si substrate was selectively etched to completely remove with the monocrystalline Si left unetched as an etch-stop material.

The rate of etching of the nonporous monocrystalline Si by the above etching solution is extremely low: about 50 Å or less for 65 minutes. Therefore, the etching selectivity ratio of the porous Si to the nonporous Si is 10$^5$ or more, so that the layer thickness decrease of the nonporous layer (several tens of Å) by etching was is practically negligible.

Similar results were obtained when other selective etching solutions were used for etching of the porous Si in place of the above selective etching solution.

Consequently, the porous Si substrate of 200 μm thick was removed, and after removal of the etching protection film, the monocrystalline Si layer of 0.1 μm thick was left on the light-transmissive substrate. No change was observed in the monocrystalline Si layer after the selective etching of the porous Si.

The monocrystalline Si layer was found to have high crystallinity by observation of cross-section by transmission electron microscopy.

Example 29

In this Example, a P-type or N-type (100) monocrystalline Si substrate having a thickness of 200 μm and resistivity of 0.01 Ω·cm was employed as the first substrate member, and was anodized in an HF solution under the anodization conditions below:

| | |
|---|---|
| Current density: | 30 mA · cm$^{-2}$ |
| Anodization solution: | HF:H$_2$O:C$_2$H$_5$OH = 1:1:1 |
| Time: | 1.6 hours |
| Porous Si thickness: | 200 μm |
| Porosity: | 56% |

On a glass substrate having a softening point at about 800° C. as the second substrate member, an amorphous Si layer was deposited in a thickness of 0.1 μm by vapor deposition under the deposition conditions below:

| | |
|---|---|
| Temperature: | room temperature |
| Pressure: | 1 × 10$^{-9}$ Torr |
| Growth rate: | 0.1 nm/min |

The surface of the porous Si and the surface of the amorphous Si were brought together into close contact, and the contacted article was heat-treated for 30 minutes at a temperature of 500° C. which is lower than the crystallization temperature of the amorphous Si to complete the bonding.

The bonded article was heat-treated at 700° C. for 30 minutes so as to grow the amorphous Si by utilizing the porous Si as the crystal growth seed by solid-phase epitaxial growth, whereby the amorphous Si grew completely by solid-phase epitaxial growth to form a monocrystalline Si film.

Then only on the glass substrate side, an Si$_3$N$_4$ film was formed as an etching protection film, and the bonded substrates were selectively etched in a 1:5 mixture of 49% hydrofluoric acid and aqueous 30% hydrogen peroxide solution with stirring. In 62 minutes, the porous Si substrate was selectively etched and completely removed with the monocrystalline Si left unetched as an etch-stop material.

The rate of etching of the nonporous monocrystalline Si by the above etching solution is extremely low: about 50 Å or less for 62 minutes. Therefore, the etching selectivity ratio of the porous Si to the nonporous Si is 10$^5$ or more, so that the layer thickness decrease of the nonporous layer (several tens of Å) by etching was practically negligible.

Similar results were obtained when other selective etching solutions were used in place of the above selective etching solution.

Consequently, the porous Si substrate of 200 μm thick was removed, and after removal of the etching protection film, the monocrystalline Si layer of 0.1 μm thick was left on the light-transmissive substrate. No change was observed in the monocrystalline Si layer after the selective etching of the porous Si.

The monocrystalline Si layer was found to have high crystallinity by observation of cross-section by transmission electron microscopy.

In this Example, a P-type or N-type (100) monocrystalline Si substrate having a thickness of 200 μm and resistivity of 0.01 Ω·cm was employed as the first substrate member, and was anodized in an HF solution under the anodization conditions below:

| | |
|---|---|
| Current density: | 30 mA · cm$^{-2}$ |
| Anodization solution: | HF:H$_2$O:C$_2$H$_5$OH = 1:1:1 |
| Time: | 1.6 hours |
| Porous Si thickness: | 200 μm |
| Porosity: | 56% |

Separately, on a fused silica substrate as the second substrate member, an amorphous Si layer was deposited in a thickness of 0.1 μm by bias sputtering under the deposition conditions below:

| | |
|---|---|
| RF frequency: | 100 MHz |
| High frequency power: | 600 W |
| Temperature: | room temperature |
| Ar gas pressure: | 8 × 10$^{-3}$ Torr |
| Target DC bias: | −200 V |
| Substrate DC bias: | +5 V |

The surface of the porous Si and the surface of the amorphous Si were brought together into close contact, and the contacted article was heat-treated for 30 minutes at a temperature of 500° C. which is lower than the crystallization temperature of the amorphous Si to complete the bonding.

The bonded article was heat-treated at 1200° C. for 1 minute by RTA (rapid thermal annealing) for epitaxial growth of the amorphous Si by utilizing the porous Si as the seed, whereby the amorphous Si grew completely by solid-phase epitaxial growth to form a monocrystalline Si film.

Then only on the fused silica substrate side, an Si$_3$N$_4$ film was formed as an etching protection film, and the bonded article was selectively etched by immersion in a hydrofluoric acid-nitric acid-acetic acid (1:3:8) solution. Since the rate of etching of porous Si is about 100 times that of monocrystalline Si as mentioned above and the rate of etching of normal monocrystalline Si is about 1 μm per minute, the amorphous Si region of 200 μm thick was removed in 2 minutes.

Consequently, the porous Si substrate of 200 μm thick was removed, and after removal of the etching protection film, the monocrystalline Si layer of 0.1 μm thick was left on the light-transmissive substrate. No change was observed in the monocrystalline Si layer after the selective etching of the porous Si.

The monocrystalline Si layer was found to have high crystallinity by observation of cross-section by transmission electron microscopy.

Example 31

In this Example, a P-type or N-type (100) monocrystalline Si substrate having a thickness of 525 μm, a diameter of 4 inches, and resistivity of 0.01 Ω·cm was employed as the first substrate member, and was anodized in an HF solution under the anodization conditions below:

| | |
|---|---|
| Current density: | 5 mA · cm$^{-2}$ |
| Anodization solution: | HF:H$_2$O:C$_2$H$_5$OH = 1:1:1 |
| Time: | 24 minutes |
| Porous Si thickness: | 20 μm |
| Porosity: | 45% |

This substrate was subjected to oxidation in an oxygen atmosphere at 400° C. for 2 hours. Thereby the inside walls of the pores of the porous Si were covered with a thermal oxidation film.

On a fused silica substrate as the second substrate member, an amorphous Si layer was deposited in a thickness of 0.1 μm by thermal CVD under the deposition conditions below:

| | |
|---|---|
| Source gas: | SiH$_4$ |
| Gas pressure: | 0.3 Torr |
| Gas flow rate: | 50 ccm |
| Temperature: | 550° C. |
| Growth rate: | 1.8 nm/min |

Into the amorphous Si layer, Si ion was implanted under the ion implantation conditions below:

| | |
|---|---|
| Si$^+$ acceleration voltage: | 70 keV |
| Amount of ion implantation: | 4 × 10$^{14}$ cm$^{-2}$ |

The surface of the porous Si and the surface of the amorphous Si were brought together into close contact, and the contacted article was heat-treated for 30 minutes at a temperature of 500° C. which is lower than the crystallization temperature of the amorphous Si to complete the bonding.

The bonded article was heat-treated at 600° C. for one hour so as to grow the amorphous Si by utilizing the porous Si as the crystal growth seed by solid-phase epitaxial growth. Thereby the amorphous Si layer entirely grew epitaxially in a solid phase to form a monocrystalline Si film.

Then, most of the first Si substrate was removed by grinding and polishing, leaving a 10 μm-thick layer thereof remaining. The fused silica substrate side only of the bonded substrates was covered with Si$_3$N$_4$ as an etching protection film, and then this remaining 10 μm-thick monocrystalline Si substrate was selectively etched with a solution of "1HF+ 20HNO$_3$+20CH$_3$COOH" by utilizing the porous Si layer having pores oxidized at the internal walls as an etch-stop layer. The entire of the first Si substrate was etched in 10 minutes, thereby the porous Si layer coming to be exposed.

The bonded article was selectively etched by 49 hydrofluoric acid with stirring. In 18.6 minutes, the porous Si substrate was selectively etched and completely removed with the monocrystalline Si left unetched as the etch-stop material.

The rate of etching of the nonporous monocrystalline Si by the above etching solution is extremely low: about 50 Å or less for 18.6 minutes. Therefore, the etching selectivity ratio of the porous Si to the nonporous Si is 10$^5$ or more, so that the thickness decrease of the nonporous layer (several tens of Å) by etching was practically negligible.

Similar results were obtained when other selective etching solutions were used in place of the above selective etching solution.

Consequently, the Si substrate was removed, and after removal of the etching protection film, the monocrystalline Si layer of 0.1 μm thick was left on the light-transmissive substrate. No change was observed in the monocrystalline Si layer after the selective etching of the porous Si.

The monocrystalline Si layer was found to have high crystallinity by observation of cross-section by transmission electron microscopy.

Example 32

In this Example, a P-type or N-type (100) monocrystalline Si substrate having a thickness of 625 μm, a diameter of 5 inches, and resistivity of 0.01 Ω·cm was employed as the first substrate member, and was anodized in an HF solution under the anodization conditions below:

| | |
|---|---|
| Current density: | 5 mA · cm$^{-2}$ |
| Anodization solution: | HF:H$_2$O:C$_2$H$_5$OH = 1:1:1 |
| Time: | 12 minutes |
| Porous Si thickness: | 10 μm |
| Porosity: | 45% |

This substrate was subjected to oxidation in an oxygen atmosphere at 400° C. for 2 hours. Thereby the inside walls of the pores of the porous Si were covered with a thermal oxidation film.

On a fused silica substrate as the second substrate member, a polycrystalline Si layer was deposited in a thickness of 0.1 μm by thermal CVD under the deposition conditions below:

| | |
|---|---|
| Source gas: | SiH$_4$ |
| Gas pressure: | 0.3 Torr |
| Gas flow rate: | 50 ccm |
| Temperature: | 620° C. |

Into the polycrystalline Si layer, Si ion was implanted to make the polycrystalline Si completely amorphous under the ion implantation conditions below:

| | |
|---|---|
| Si$^+$ acceleration voltage: | 40 keV |
| Amount of ion implantation: | 5 × 10$^{15}$ cm$^{-2}$ |

The surface of the porous Si and the surface of the amorphous Si were brought together into close contact, and the contacted article was heat-treated for 30 minutes at a temperature of 500° C. which is lower than the crystallization temperature of the amorphous Si to complete the bonding.

The bonded article was heat-treated at 600° C. for 2 hours so as to grow the amorphous Si by utilizing the porous Si as the crystal growth seed by solid-phase epitaxial growth. Thereby the amorphous Si layer entirely grew epitaxially in a solid phase to form a monocrystalline Si film.

Then, most of the first Si substrate was removed by grinding and polishing, leaving a 5 μm-thick layer thereof remaining. Only the fused silica substrate side of the bonded substrate members was covered with Si$_3$N$_4$ as an etching protection film, and the remaining monocrystalline Si substrate was selectively etched with a mixture of "ethylenediamine+pyrocatechol+water (mixing ratio of 17 ml:3 g:8 ml) at 110° C. by utilizing the porous Si layer having pores oxidized at the internal walls as an etch-stop layer. The entire of the first Si substrate was etched in 3 minutes, whereby the whole porous Si layer region came to be exposed.

The bonded substrates were selectively etched by a 10:6:50 mixture of 49% hydrofluoric acid, alcohol and 30% hydrogen peroxide without stirring. In 11.4 minutes, the porous Si substrate was selectively etched and completely removed with the monocrystalline Si left unetched as the etch-stop material.

The rate of etching of the nonporous monocrystalline Si by the above etching solution is extremely low: about 50 Å or less for 11.4 minutes. Therefore, the etching selectivity ratio of the porous Si to the nonporous Si is 10$^5$ or more, so that the thickness decrease of the nonporous layer (several tens of Å) by etching was practically negligible.

Similar results were obtained when other selective etching solutions were used in place of the above selective etching solution.

Consequently, the Si substrate was removed, and after removal of the etching protection film, the monocrystalline Si layer of 0.1 μm thick was left on the light-transmissive substrate. No change was observed in the monocrystalline Si layer after the selective etching of the porous Si.

The monocrystalline Si layer was found to have high crystallinity by observation of cross-section by transmission electron microscopy.

Example 33

A P-type or N-type (100) monocrystalline Si substrate having a thickness of 625 μm, a diameter of 6 inches, and resistivity of 0.01 Ω·cm was employed as the first substrate member, and was anodized in an HF solution under the anodization conditions below:

| | |
|---|---|
| Current density: | 5 mA · cm$^{-2}$ |
| Anodization solution: | HF:H$_2$O:C$_2$H$_5$OH = 1:1:1 |
| Time: | 12 minutes |
| Porous Si thickness: | 10 μm |
| Porosity: | 45% |

This substrate was subjected to oxidation in an oxygen atmosphere at 400° C. for 2 hours. Thereby the inside walls of the pores of the porous Si were covered with a thermal oxidation film.

On a fused silica substrate as the second substrate member, an amorphous Si layer was deposited in a thickness of 0.1 μm by thermal CVD under the deposition conditions below:

| | |
|---|---|
| Source gas: | Si$_2$H$_6$ |
| Gas pressure: | 0.3 Torr |
| Temperature: | 520° C. |

The surface of the porous Si and the surface of the amorphous Si were brought together into close contact, and the contacted article was heat-treated for 30 minutes at a temperature of 500° C. which is lower than the crystallization temperature of the amorphous Si to complete the bonding.

The bonded article was heat-treated at 600° C. for one hour so as to grow the amorphous Si by utilizing the porous Si as the crystal growth seed by solid-phase epitaxial growth. Thereby the amorphous Si layer entirely grew epitaxially in a solid phase to form a monocrystalline Si film.

Then, most of the first Si substrate was removed by grinding and polishing, leaving a 5 μm-thick layer thereof remaining. The fused silica substrate side only of the bonded substrates was covered with Si$_3$N$_4$ as an etching protection film, and the remaining monocrystalline Si substrate was selectively etched with aqueous 30% KOH solution at 110° C. by utilizing the porous Si layer having pores oxidized at the internal walls as an etch-stop layer. The entire of the first Si substrate was etched in one minute, whereby the whole porous Si layer region came to be exposed.

The bonded substrates were selectively etched by a 1:5 mixture of 49% hydrofluoric acid and 30% hydrogen peroxide with stirring. In 11.1 minutes, the porous Si substrate was selectively etched and completely removed with the monocrystalline Si left unetched as the etch-stop material.

The rate of etching of the nonporous monocrystalline Si by the above etching solution is extremely low: about 50 Å or less for 11.1 minutes. Therefore, the etching selectivity ratio of the porous Si to the nonporous Si is $10^5$ or more, so that the thickness decrease of the nonporous layer (several tens of Å) by etching was practically negligible.

Similar results were obtained when other selective etching solutions were used in place of the above selective etching solution.

Consequently, the Si substrate was removed, and after removal of the etching protection film, the monocrystalline Si layer of 0.1 μm thick was left on the light-transmissive substrate. No change was observed in the monocrystalline Si layer after the selective etching of the porous Si.

The monocrystalline Si layer was found to have high crystallinity by observation of cross-section by transmission electron microscopy.

Example 34

A P-type or N-type (100) monocrystalline Si substrate having a thickness of 625 μm, a diameter of 6 inches, and resistivity of 0.01 Ω·cm was employed as the first substrate member, and was anodized in an HF solution under the anodization conditions below:

| Current density: | 5 mA · cm$^{-2}$ |
| --- | --- |
| Anodization solution: | HF:H$_2$O:C$_2$H$_5$OH = 1:1:1 |
| Time: | 12 minutes |
| Porous Si thickness: | 10 μm |
| Porosity: | 45% |

This substrate was subjected to oxidation in an oxygen atmosphere at 400° C. for 2 hours. Thereby the inside walls of the pores of the porous Si were covered with a thermal oxidation film.

On a ceramic substrate as the second substrate member, an Si$_3$N$_4$ layer of 100 nm thick, and further thereon an SiO$_2$ layer of 500 nm thick were formed by CVD. Further on the SiO$_2$ layer, an amorphous Si layer was deposited in a thickness of 0.1 μm by thermal CVD under the deposition conditions below:

| Source gas: | Si$_2$H$_6$ |
| --- | --- |
| Gas pressure: | 0.3 Torr |
| Temperature: | 520° C. |

The surface of the porous Si and the surface of the amorphous Si were brought together into close contact, and the contacted article was heat-treated for 30 minutes at a temperature of 500° C. which is lower than the crystallization temperature of the amorphous Si to complete the bonding.

The bonded article was heat-treated at 600° C. for one hour so as to grow the amorphous Si by utilizing the porous Si as the crystal growth seed by solid-phase epitaxial growth. Thereby the amorphous Si layer entirely grew epitaxially in a solid phase to form a monocrystalline Si film.

Then, most of the first Si substrate was removed by grinding and polishing, leaving a 10 μm-thick layer thereof remaining. Only the ceramic substrate side of the bonded substrates was covered with Si$_3$N$_4$ as an etching protection film, and the remaining monocrystalline Si substrate was selectively etched with a solution of "1HF+10HNO$_3$+10CH$_3$COOH" by utilizing the porous Si layer having pores oxidized at the internal walls as an etch-stop layer. The entire of the first Si substrate was etched in 5 minutes, whereby the porous Si layer came to be exposed.

Then, the bonded article was selectively etched by a 10:1 mixture of 49% hydrofluoric acid and alcohol without stirring. In 12.7 minutes, the porous Si substrate was selectively etched and completely removed with the monocrystalline Si left unetched as the etch-stop material.

The rate of etching of the nonporous monocrystalline Si by the above etching solution is extremely low: about 50 Å or less for 12.7 minutes. Therefore, the etching selectivity ratio of the porous Si to the nonporous Si is $10^5$ or more, so that the thickness decrease of the nonporous layer (several tens of Å) by etching was practically negligible.

Similar results were obtained when other selective etching solutions were used in place of the above selective etching solution.

Consequently, the Si substrate was removed, and after removal of the etching protection film, the monocrystalline Si layer of 0.1μm thick was left on the ceramic substrate. No change was observed in the monocrystalline Si layer after the selective etching of the porous Si.

The monocrystalline Si layer was found to have high crystallinity by observation of cross-section by transmission electron microscopy.

Any substrate could be used in place of the ceramic substrate.

Example 35

A P-type or N-type (100) monocrystalline Si substrate having a thickness of 525 μm, a diameter of 4 inches, and resistivity of 0.01 Ω·cm was employed as the first substrate member, and was anodized in an HF solution under the anodization conditions below:

| Current density: | 5 mA · cm$^{-2}$ |
| --- | --- |
| Anodization solution: | HF:H$_2$O:C$_2$H$_5$OH = 1:1:1 |
| Time: | 12 minutes |
| Porous Si thickness: | 10 μm |
| Porosity: | 46% |

This substrate was subjected to oxidation in an oxygen atmosphere at 400° C. for one hour. Thereby the inside walls of the pores of the porous Si were covered with a thermal oxidation film.

On a fused silica substrate as the second substrate member, a CVD-SiO$_2$ layer of 500 nm thick was formed. Further on the SiO$_2$ layer, an amorphous Si layer was deposited in a thickness of 0.1 μm by thermal CVD under the deposition conditions below:

| Source gas: | SiH$_4$ |
| --- | --- |
| Gas pressure: | 0.3 Torr |
| Gas flow rate: | 50 ccm |
| Temperature: | 550° C. |
| Growth rate: | 1.8 nm/min |

The surface of the porous Si and the surface of the amorphous Si were brought together into close contact, and the contacted article was heat-treated for 2 hours at a temperature of 300° C. which is lower than the crystallization temperature of the amorphous Si to complete the bonding.

Then, most of the first Si substrate was removed by grinding and polishing, leaving a 10 μm-thick layer thereof remaining. Thereafter, the bonded article was heat-treated at 600° C. for one hour so as to grow the amorphous Si by utilizing the porous Si as the crystal growth seed by solid-phase epitaxial growth. Thereby the amorphous Si layer entirely grew epitaxially in a solid phase to form a monocrystalline Si film.

Only the fused silica substrate side of the bonded substrates was covered with $Si_3N_4$ as an etching protection film, and the remaining 10 μm-thick monocrystalline Si substrate was selectively etched with a solution of "1HF+20$HNO_3$+20$CH_3COOH$" by utilizing the porous Si layer having pores oxidized at the internal walls as an etch-stop layer. The all of the first Si substrate was etched in 10 minutes, whereby the porous Si layer came to be exposed.

Then, the bonded article was selectively etched by a 10:6:50 mixture of 49% hydrofluoric acid, alcohol and aqueous 30% hydrogen peroxide without stirring. In 11.4 minutes, the porous Si substrate was selectively etched and completely removed with the monocrystalline Si left unetched as the etch-stop material.

The rate of etching of the nonporous monocrystalline Si by the above etching solution is extremely low: about 50 Å or less for 11.4 minutes. Therefore, the etching selectivity ratio of the porous Si to the nonporous Si is $10^5$ or more, so that the thickness decrease of the nonporous layer (several tens of Å) by etching was practically negligible.

Similar results were obtained when other selective etching solutions were used in place of the above selective etching solution.

Consequently, the Si substrate was removed, and after removal of the etching protection film, the monocrystalline Si layer of 0.1 μm thick was left on the light-transmissive substrate. No change was observed in the monocrystalline Si layer after the selective etching of the porous Si.

The monocrystalline Si layer was found to have high crystallinity by observation of cross-section by transmission electron microscopy.

Example 36

A P-type or N-type (100) monocrystalline Si substrate having a thickness of 625 μm, a diameter of 5 inches, and resistivity of 0.01 Ω·cm was employed as the first substrate member, and was anodized in an HF solution under the anodization conditions below:

| | |
|---|---|
| Current density: | 5 mA · $cm^{-2}$ |
| Anodization solution: | HF:$H_2O$:$C_2H_5OH$ = 1:1:1 |
| Time: | 24 minutes |
| Porous Si thickness: | 20 μm |
| Porosity: | 45% |

This substrate was subjected to oxidation in an oxygen atmosphere at 400° C. for 2 hours. Thereby the inside walls of the pores of the porous Si were covered with a thermal oxidation film.

On a glass substrate having a softening point of about 800° C. as the second substrate member, an amorphous Si layer was deposited in a thickness of 0.1 μm by vapor deposition under the deposition conditions below:

| | |
|---|---|
| Temperature: | room temperature |
| Pressure: | 1 × $10^{-9}$ Torr |
| Growth rate: | 0.1 nm/sec |

The surface of the porous Si and the surface of the amorphous Si were brought together into close contact, and the contacted article was heat-treated for 50 hours at a temperature of 200° C. which is lower than the crystallization temperature of the amorphous Si to complete the bonding.

Then, most of the first Si substrate was removed by grinding and polishing, leaving a 5 μm-thick layer thereof remaining.

The glass substrate side only of the bonded substrates was covered with $Si_3N_4$ as an etching protection film, and the remaining 5 μm-thick monocrystalline Si substrate was selectively etched with a solution of "1HF+10$HNO_3$+10$CH_3COOH$" by utilizing the porous Si layer having pores oxidized at the internal walls as an etch-stop layer. The all of the first Si substrate was etched in 5 minutes, whereby the porous Si layer came to be exposed.

Thereafter, the bonded article was heat-treated at 700° C. for one hour so as to grow the amorphous Si by utilizing the porous Si as the crystal growth seed by solid-phase epitaxial growth. Thereby the amorphous Si layer entirely grew epitaxially in a solid phase to form a monocrystalline Si film.

Then, the bonded article was selectively etched by a 1:5 mixture of 49% hydrofluoric acid and aqueous 30% hydrogen peroxide solution with stirring. In 16.1 minutes, the porous Si substrate was selectively etched and completely removed with the monocrystalline Si left unetched as the etch-stop material.

The rate of etching of the nonporous monocrystalline Si by the above etching solution is extremely low: about 50 Å or less for 16.1 minutes. Therefore, the etching selectivity ratio of the porous Si to the nonporous Si is $10^5$ or more, so that the thickness decrease of the nonporous layer (several tens of Å) by etching was practically negligible.

Similar results were obtained when other selective etching solutions were used in place of the above selective etching solution.

Consequently, the Si substrate was removed, and after removal of the etching protection film, the monocrystalline Si layer of 0.1 μm thick was left on the light-transmissive substrate. No change was observed in the monocrystalline Si layer after the selective etching of the porous Si.

The monocrystalline Si layer was found to have high crystallinity by observation of cross-section by transmission electron microscopy.

Example 37

A P-type or N-type (100) monocrystalline Si substrate having a thickness of 625 μm, a diameter of 6 inches, and resistivity of 0.01 Ω·cm was employed as the first substrate member, and was anodized in an HF solution under the anodization conditions below:

| | |
|---|---|
| Current density: | 5 mA · $cm^{-2}$ |
| Anodization solution: | HF:$H_2O$:$C_2H_5OH$ = 1:1:1 |
| Time: | 12 minutes |
| Porous Si thickness: | 10 μm |
| Porosity: | 45% |

This substrate was subjected to oxidation in an oxygen atmosphere at 400° C. for 2 hours. Thereby the inside walls of the pores of the porous Si were covered with a thermal oxidation film.

On a fused silica substrate as the second substrate member, an amorphous Si layer was deposited in a thickness of 0.1 μm by bias sputtering under the deposition conditions below:

| | |
|---|---|
| RF frequency: | 100 MHz |
| High frequency power: | 600 W |
| Temperature: | room temperature |
| Ar gas pressure: | 8 × 10⁻³ Torr |
| Target DC bias: | −200 V |
| Substrate DC bias: | +5 V |

The surface of the porous Si and the surface of the amorphous Si were brought together into close contact, and the contacted article was heat-treated for 24 hours at a temperature of 400° C. which is lower than the crystallization temperature of the amorphous Si to complete the bonding.

Then, most of the first Si substrate was removed by grinding and polishing, leaving a 10 μm-thick layer thereof remaining. Thereafter, the bonded article was heat-treated at 1200° C. for one minute by RTA (rapid thermal annealing) so as to grow the amorphous Si by utilizing the porous Si as the crystal growth seed by solid-phase epitaxial growth. Thereby the amorphous Si layer entirely grew epitaxially in a solid phase to form a monocrystalline Si film.

The fused silica substrate side only of the bonded substrates was covered with $Si_3N_4$ as an etching protection film, and the remaining 10 μm-thick monocrystalline Si substrate was selectively etched with a solution of "$1HF+40HNO_3+40CH_3COOH$" by utilizing the porous Si layer having pores oxidized at the internal walls as an etch-stop layer. All of the first Si substrate was etched in 15 minutes, whereby the porous Si layer came to be exposed.

Then, the bonded article was immersed in a hydrofluoric acid-nitric acid-acetic acid (1:3:8) solution. As described above, the rate of etching of porous Si is about 100 times that of monocrystalline Si, and the rate of etching of normal monocrystalline Si by the hydrofluoric acid-nitric acid-acetic acid (1:3:8) solution is about 1 μm per minute. Therefore, the porous Si substrate of 10 μm was removed within one minute.

Consequently, the Si substrate was removed, and after removal of the etching protection film, the monocrystalline Si layer of 0.1 μm thick was left on the light-transmissive substrate. No change was observed in the monocrystalline Si layer after the selective etching of the porous Si.

The monocrystalline Si layer was found to have high crystallinity by observation of cross-section by transmission electron microscopy.

Example 38

In this Example, a P-type or N-type (100) monocrystalline Si substrate having a thickness of 525 μm, a diameter of 4 inches, and resistivity of 0.01 Ω·cm was employed as the first substrate member, and was anodized in an HF solution under the anodization onditions below:

| | |
|---|---|
| Current density: | 5 mA · cm⁻² |
| Anodization solution: | $HF:H_2O:C_2H_5OH = 1:1:1$ |
| Time: | 24 minutes |
| Porous Si thickness: | 20 μm |
| Porosity: | 45% |

This substrate was subjected to oxidation in an oxygen atmosphere at 400° C. for 2 hours. Thereby the inside walls of the pores of the porous Si were covered with a thermal oxidation film.

On a fused silica substrate as the second substrate member, an amorphous Si layer was deposited in a thickness of 0.1 μm by thermal CVD under the deposition conditions below:

| | |
|---|---|
| Source gas: | $SiH_4$ |
| Gas pressure: | 0.3 Torr |
| Gas flow rate: | 50 ccm |
| Temperature: | 550° C. |
| Growth rate: | 1.8 nm/min |

Into the amorphous Si layer, Si ion was implanted under the ion implantation conditions below:

| | |
|---|---|
| Si⁺ acceleration voltage: | 70 keV |
| Amount of ion implantation: | 4 × 10¹⁴ cm⁻² |

The surface of the porous Si and the surface of the amorphous Si were brought together into close contact. The contacted article was subjected to anodic bonding at room temperature, and then heat-treated for 2 hours at a temperature of 450° C. which is lower than the crystallization temperature of the amorphous Si to complete the bonding.

Then, most of the first Si substrate was removed by grinding and polishing, leaving a 10 μm-thick layer thereof remaining. The fused silica substrate side only of the bonded substrates was covered with $Si_3N_4$ as an etching protection film, and then the remaining 10 μm-thick monocrystalline Si substrate was selectively etched with a solution of "$1HF+20HNO_3+20CH_3COOH$" by utilizing the porous Si layer having pores oxidized at the internal walls as an etch-stop layer. The entire of the first Si substrate was etched in 10 minutes, whereby the porous Si layer came to be exposed.

The bonded article was heat-treated at 600° C. for one hour so as to grow the amorphous Si by utilizing the porous Si as the crystal growth seed by solid-phase epitaxial growth. Thereby the amorphous Si layer entirely grew epitaxially in a solid phase to form a monocrystalline Si film.

The bonded article was selectively etched by 49% hydrofluoric acid with stirring. In 18.6 minutes, the porous Si substrate was selectively etched and completely removed with the monocrystalline Si left unetched as the etch-stop material.

The rate of etching of the nonporous monocrystalline Si by the above etching solution is extremely low: about 50 Å or less for 18.6 minutes. Therefore, the etching selectivity ratio of the porous Si to the nonporous Si is $10^5$ or more, so that the thickness decrease of the nonporous layer (several tens of Å) by etching was practically negligible.

Similar results were obtained when other selective etching solutions were used in place of the above selective etching solution.

Consequently, the Si substrate was removed, and after removal of the etching protection film, the monocrystalline Si layer of 0.1 μm thick was left on the light-transmissive substrate. No change was observed in the monocrystalline Si layer after the selective etching of the porous Si.

The monocrystalline Si layer was found to have high crystallinity by observation of cross-section by transmission electron microscopy.

Example 39

A P-type or N-type (100) monocrystalline Si substrate having a thickness of 625 μm, a diameter of 5 inches, and resistivity of 0.01 Ω·cm was employed as the first substrate member, and was anodized in an HF solution under the anodization conditions below:

| Current density: | 5 mA · cm$^{-2}$ |
|---|---|
| Anodization solution: | HF:H$_2$O:C$_2$H$_5$OH = 1:1:1 |
| Time: | 12 minutes |
| Porous Si thickness: | 10 μm |
| Porosity: | 45% |

This substrate was subjected to oxidation in an oxygen atmosphere at 400° C. for 2 hours. Thereby the inside walls of the pores of the porous Si were covered with a thermal oxidation film.

On a fused silica substrate as the second substrate member, a polycrystalline Si layer was deposited in a thickness of 0.1 μm by thermal CVD under the deposition conditions below:

| Source gas: | SiH$_4$ |
|---|---|
| Gas pressure: | 0.3 Torr |
| Gas flow rate: | 50 ccm |
| Temperature: | 620° C. |

Into the polycrystalline Si layer, Si ion was implanted to make the polycrystalline Si completely amorphous under the ion implantation conditions below:

| Si$^+$ acceleration voltage: | 40 keV |
|---|---|
| Amount of ion implantation: | 5 × 10$^{15}$ cm$^{-2}$ |

The surface of the porous Si and the surface of the amorphous Si were brought together into close contact, and the contacted article was bonded by anodic bonding at a temperature of 400° C. which is lower than the crystallization temperature of the amorphous Si.

Then, most of the first Si substrate was removed by grinding and polishing, leaving a 5 μm-thick layer thereof remaining. Thereafter, the bonded article was heat-treated at 600° C. for 2 hours so as to grow the amorphous Si by utilizing the porous Si as the crystal growth seed by solid-phase epitaxial growth. Thereby the amorphous Si layer entirely grew epitaxially in a solid phase to form a monocrystalline Si film.

The fused silica substrate side only of the bonded substrate members was covered with Si$_3$N$_4$ as an etching protection film, and this remaining monocrystalline Si substrate was selectively etched with a mixture of "ethylenediamine+pyrocatechol+water (mixing ratio of 17 ml:3 g:8 ml) at 110° C. by utilizing the porous Si layer having pores oxidized at the internal walls as an etch-stop layer. The entire of the first Si substrate was etched in 3 minutes, whereby the whole of the porous Si layer region came to be exposed.

The bonded substrate members were selectively etched by a 10:6:50 mixture of 49% hydrofluoric acid, alcohol and 30% hydrogen peroxide without stirring. In 11.4 minutes, the porous Si substrate was selectively etched and completely removed with the monocrystalline Si left unetched as the etch-stop material.

The rate of etching of the nonporous monocrystalline Si by the above etching solution is extremely low: about 50 Å or less for 11.4 minutes. Therefore, the etching selectivity ratio of the porous Si to the nonporous Si is 10$^5$ or more, so that the thickness decrease of the nonporous layer (several tens of Å) by etching was practically negligible.

Similar results were obtained when other selective etching solutions were used in place of the above selective etching solution.

Consequently, the Si substrate was removed, and after removal of the etching protection film, the monocrystalline Si layer of 0.1 μm thick was left on the light-transmissive substrate. No change was observed in the monocrystalline Si layer after the selective etching of the porous Si.

The monocrystalline Si layer was found to have high crystallinity by observation of cross-section by transmission electron microscopy.

Example 40

A P-type or N-type (100) monocrystalline Si substrate having a thickness of 625 μm, a diameter of 6 inches, and resistivity of 0.01 Ω·cm was employed as the first substrate member, and was anodized in an HF solution under the anodization conditions below:

| Current density: | 5 mA · cm$^{-2}$ |
|---|---|
| Anodization solution: | HF:H$_2$O:C$_2$H$_5$OH = 1:1:1 |
| Time: | 12 minutes |
| Porous Si thickness: | 10 μm |
| Porosity: | 45% |

This substrate was subjected to oxidation in an oxygen atmosphere at 400° C. for 2 hours. Thereby the inside walls of the pores of the porous Si were covered with a thermal oxidation film.

On a fused silica substrate as the second substrate member, an amorphous Si layer was deposited in a thickness of 0.1 μm by thermal CVD under the deposition conditions below:

| Source gas: | Si$_2$H$_6$ |
|---|---|
| Gas pressure: | 0.3 Torr |
| Temperature: | 520° C. |

The surface of the porous Si and the surface of the amorphous Si were brought together into close contact, and the contacted article was heat-treated for 100 hours at a temperature of 200° C. which is lower than the crystallization temperature of the amorphous Si to complete the bonding.

Then, most of the first Si substrate was removed by grinding and polishing, leaving a 5 μm-thick layer thereof remaining. The fused silica substrate side only of the bonded substrate members was covered with Si$_3$N$_4$ as an etching protection film, and this remaining monocrystalline Si substrate was selectively etched with aqueous 30% KOH solution at 110° C. by utilizing the porous Si layer having pores oxidized at the inside walls as an etch-stop layer. The entire of the first Si substrate was etched in one minute, whereby the whole porous Si layer region came to be exposed.

The bonded article was heat-treated at 600° C. for one hour so as to grow the amorphous Si by utilizing the porous Si as the crystal growth seed by solid-phase epitaxial growth. Thereby the amorphous Si layer entirely grew epitaxially in a solid phase to form a monocrystalline Si film.

The bonded article was selectively etched by a 1:5 mixture of 49% hydrofluoric acid and 30% hydrogen peroxide with stirring. In 11.1 minutes, the porous Si substrate was selectively etched and completely removed with the monocrystalline Si left unetched as the etch-stop material.

The rate of etching of the nonporous monocrystalline Si by the above etching solution is extremely low: about 50 Å or less for 11.1 minutes. Therefore, the etching selectivity ratio of the porous Si to the nonporous Si is $10^5$ or more, so that the thickness decrease of the nonporous layer (several tens of Å) by etching was practically negligible.

Similar results were obtained when other selective etching solutions were used in place of the above selective etching solution.

Consequently, the porous Si substrate was removed, and after removal of the etching protection film, the monocrystalline Si layer of 0.1 µm thick was left on the light-transmissive substrate. No change was observed in the monocrystalline Si layer after the selective etching of the porous Si.

The monocrystalline Si layer was found to have high crystallinity by observation of cross-section by transmission electron microscopy.

Example 41

A P-type or N-type (100) monocrystalline Si substrate having a thickness of 625 µm, a diameter of 6 inches, and resistivity of 0.01 Ω·cm was employed as the first substrate member, and was anodized in an HF solution under the anodization conditions below:

| | |
|---|---|
| Current density: | 5 mA · cm$^{-2}$ |
| Anodization solution: | HF:H$_2$O:C$_2$H$_5$OH = 1:1:1 |
| Time: | 12 minutes |
| Porous Si thickness: | 10 µm |
| Porosity: | 45% |

This substrate was subjected to oxidation in an oxygen atmosphere at 400° C. for 2 hours. Thereby the inside walls of the pores of the porous Si were covered with a thermal oxidation film.

On another substrate made of ceramic as the second substrate member, an Si$_3$N$_4$ layer of 100 nm thick, and further thereon an SiO$_2$ layer of 500 nm thick were formed by CVD. Further on the SiO$_2$ layer, an amorphous Si layer was deposited in a thickness of 0.1 µm by thermal CVD under the deposition conditions below:

| | |
|---|---|
| Source gas: | Si$_2$H$_6$ |
| Gas pressure: | 0.3 Torr |
| Temperature: | 520° C. |

The surface of the porous Si and the surface of the amorphous Si were brought together into close contact, and the contacted article was heat-treated for 30 hours at a temperature of 300° C. which is lower than the crystallization temperature of the amorphous Si to complete the bonding.

The ceramic substrate side only of the bonded substrate members was covered with Si$_3$N$_4$ as an etching protection film. Then most of the first Si substrate was removed by etching with a solution of "66HNO$_3$+34 HF", leaving a 10 µm-thick layer thereof remaining. The remaining 10 µm-thick monocrystalline Si substrate was selectively etched with a solution of "1HF+10HNO$_3$+10CH$_3$COOH" by utilizing the porous Si layer having pores oxidized at the internal walls as an etch-stop layer. The entire of the first Si substrate was etched in 5 minutes, thereby the porous Si layer coming to be exposed.

The bonded substrate members were heat-treated at 600° C. for one hour so as to grow the amorphous Si by utilizing the porous Si as the crystal growth seed by solid-phase epitaxial growth. Thereby the amorphous Si layer entirely grew epitaxially in a solid phase to form a monocrystalline Si film.

The bonded substrates were selectively etched by a 10:1 mixture of 49% hydrofluoric acid and alcohol without stirring. In 12.7 minutes, the porous Si substrate was selectively etched and completely removed with the monocrystalline Si left unetched as the etch-stop material.

The rate of etching of the nonporous monocrystalline Si by the above etching solution is extremely low: about 50 Å or less for 12.7 minutes. Therefore, the etching selectivity ratio of the porous Si to the nonporous Si is $10^5$ or more, so that the thickness decrease of the nonporous layer (several tens of Å) by etching was practically negligible.

Similar results were obtained when other selective etching solutions were used in place of the above selective etching solution.

Consequently, the porous Si substrate was removed, and after removal of the etching protection film, the monocrystalline Si layer of 0.1 µm thick was left on the ceramic substrate. No change was observed in the monocrystalline Si layer after the selective etching of the porous Si.

The monocrystalline Si layer was found to have high crystallinity by observation of cross-section by transmission electron microscopy.

Any substrate could be used in place of the ceramic substrate.

Example 42

A P-type or N-type (100) monocrystalline Si substrate having a thickness of 625 µm, a diameter of 5 inches, and resistivity of 0.01 Ω·cm was employed as the first substrate member, and was anodized in an HF solution under the anodization conditions below:

| | |
|---|---|
| Current density: | 5 mA · cm$^{-2}$ |
| Anodization solution: | HF:H$_2$O:C$_2$H$_5$OH = 1:1:1 |
| Time: | 12 minutes |
| Porous Si thickness: | 10 µm |
| Porosity: | 45% |

This substrate was subjected to oxidation in an oxygen atmosphere at 400° C. for one hour. Thereby the inside walls of the pores of the porous Si were covered with a thermal oxidation film.

On a fused silica substrate as the second substrate member, an amorphous GaAs layer was deposited in a thickness of 0.2 µm by MOCVD or MBE. The deposition was conducted under the deposition conditions employed generally in semiconductor processes.

The surface of the porous Si and the surface of the amorphous GaAs were brought together into close contact, and the contacted article was heat-treated for 10 hours at a temperature of 200° C. which is lower than the crystallization temperature of the amorphous GaAs to complete the bonding.

Then, most of the first Si substrate was removed by grinding and polishing, leaving a 10 µm-thick layer thereof remaining. Thereafter, the bonded article was heat-treated at 600° C. for one hour so as to grow the amorphous GaAs by utilizing the porous Si as the crystal growth seed by solid-phase epitaxial growth. Thereby the amorphous GaAs layer entirely grew epitaxially in a solid phase to form a monocrystalline GaAs film.

The fused silica substrate side only of the bonded substrate members were covered with $Si_3N_4$ as an etching protection film, and the remaining 10 μm-thick monocrystalline Si substrate was selectively etched with a solution of "$1HF+20HNO_3+20CH_3COOH$" by utilizing the porous Si layer having pores oxidized at the internal walls as an etch-stop layer. The all of the first substrate of Si was etched in 10 minutes, whereby the porous Si layer came to be exposed.

The oxide film of the porous layer was removed by hydrofluoric acid. Thereafter the porous Si layer was etched by a mixture of ethylenediamine, pyrocatechol and water (mixing ratio of 17 ml:3 g:8 ml) at 110° C. In one minute, the porous Si was selectively etched and removed completely by utilizing the monocrystalline GaAs as the etch-stop material, with the monocrystalline GaAs remaining unetched.

The rate of etching of the monocrystalline GaAs by the above etching solution is extremely low: about 50 Å or less for 1 minute. Therefore, the thickness decrease of the GaAs layer (several tens of Å) by etching was practically negligible.

The etching solution in this etching process is not limited to the one employed above. Any etching solution may be used which is capable of etching the porous Si and does not etch GaAs.

Consequently, the Si substrate was removed, and after the removal of the etching protection film, the monocrystalline GaAs layer of 0.1 μm thick was left on the light-transmissive substrate. No change was observed in the monocrystalline GaAs layer after the selective etching of the porous Si.

The monocrystalline GaAs layer was found to have high crystallinity by observation of cross-section by transmission electron microscopy.

Example 43

The surface of a monocrystalline GaAs of 3 inches in diameter as a first substrate was made porous.

On a fused silica substrate as a second substrate, an amorphous Si layer was deposited in a thickness of 0.1 μm by thermal CVD under the deposition conditions below:

| Source gas: | $SiH_4$ |
|---|---|
| Gas pressure: | 0.3 Torr |
| Gas flow rate: | 50 ccm |
| Temperature: | 550° C. |
| Growth rate: | 1.8 nm/min |

The surface of the porous GaAs and the surface of the amorphous Si were brought together into close contact, and the contacted article was heat-treated for hours at a temperature of 300° C. which is lower than the crystallization temperature of the amorphous Si to complete the bonding.

Then, most of the first GaAs substrate was removed by grinding and polishing, leaving a 10 μm-thick layer thereof remaining. Thereafter, the bonded article was heat-treated at 600° C. for one hour so as to grow the amorphous Si by utilizing the porous GaAs as the crystal growth seed by solid-phase epitaxial growth. Thereby the amorphous Si layer entirely grew epitaxially in a solid phase to form a monocrystalline Si film.

The fused silica substrate side only of the bonded substrate members was covered with $Si_3N_4$ as an etching protection film, and the remaining monocrystalline GaAs substrate was etched with a mixture of "$H_2SO_4+H_2O_2+H_2O$". Then by use of the same etching solution, porous GaAs layer was selectively etched. The porous GaAs was removed completely with the monocrystalline Si remaining as the etch-stop material.

The etching solution in this etching process is not limited to the one employed above. Any etching solution may be used which is capable of etching the porous GaAs and does not etch monocrystalline Si.

Consequently, the GaAs substrate was removed, and after the removal of the etching protection film, the monocrystalline Si layer of 0.1 μm thick was left on the light-transmissive substrate. No change was observed in the monocrystalline Si layer after the selective etching of the porous GaAs.

The monocrystalline Si layer was found to have high crystallinity by observation of cross-section by transmission electron microscopy.

As described above, the present invention provides a process for producing semiconductor device substrate which has solved the above-mentioned problems.

The present invention provides a process for forming a monocrystalline Si layer with high crystallinity on an insulating substrate, which is advantageous in productivity, uniformity, controllability, and cost.

The present provides a semiconductor device substrate which is applicable for conventional SOI device and realizes the advantage of the SOI.

The present invention provides a process for producing a semiconductor device substrate which is useful in place of expensive SOS and SIMOX in production of large scale integrated circuits of SOI structure.

In the present invention, a monocrystalline Si layer is formed by transforming a monocrystalline Si substrate of originally high quality into porous Si which is removable selectively and by growing an amorphous Si layer formed on an insulating layer through solid-phase epitaxial growth to form a monocrystalline Si layer while utilizing the resulting porous monocrystalline Si as a crystal growth seed. This process enables treatment of many products in a short time, giving great advantages in productivity and economy.

In the present invention, the amorphous Si on an insulating layer is grown in a vertical direction through solid-phase epitaxial growth. Therefore, the required growth length is only the thickness of amorphous Si layer, so that the growth is completed in a short time, and the crystallinity of the film is greatly improved in comparison with lateral solid-phase epitaxial growth which is practiced in production of SOI. Moreover, the present process enables formation of a solid-phase epitaxial monocrystalline layer over the whole face of a wafer, which gives great improvement in productivity and economics.

In the present invention, in etching of porous Si, a buffered hydrofluoric acid type of wet chemical etching solution may be used which does not adversely affect the semiconductor process, and the etching selectivity ratio of the porous Si to the nonporous Si is more than $10^5$, which gives great advance in controllability and productivity.

In the present invention, in etching of porous Si, a buffered hydrofluoric acid type of wet chemical etching solution may also be used which does not adversely affect the semiconductor process, and the etching selectivity ratio of the porous Si to the nonporous Si is more than $10^5$, which gives great advance in controllability and productivity.

The present invention provides an excellent process for producing a monocrystalline Si layer with high crystallinity on an light-transmissive substrate by use of a light-transmissive substrate of a different kind of material, which is advantageous in productivity, uniformity, controllability, and economics. This process enables formation of a high-performance driving element on a monocrystalline Si, thereby giving a sensor or image elements (picture elements) of a displaying device with higher density, higher resolution and higher fineness.

The present invention enables formation of three-dimensional structure in combination with another functional device, or enables use of a material other than Si as a substrate which has properties not achievable with Si, such as light-transmissivity, high heat releasability, high mechanical strength, and low cost.

In an aspect of the present invention, the amorphous Si is grown on a substrate made of another kind of material in a vertical direction through solid-phase epitaxial growth. Therefore, the required growth length is only the thickness of amorphous Si layer, so that the growth is completed in a short time, and the crystallinity of the film is greatly improved in comparison with lateral solid-phase epitaxial growth which is practiced in production of SOI. Moreover, the present process enables formation of solid-phase epitaxial monocrystalline layer over the whole face of a wafer, which gives great improvement in productivity and economics.

In the present invention, an Si substrate is made thin by grinding and polishing before solid epitaxial growth whereby peeling or breaking of bonded substrates is avoided in the solid-phase growth at a temperature higher than the solid-phase growth temperature, even when different substrates having different thermal expansion coefficients is bonded.

The process for producing a semiconductor device substrate of the present invention gives a uniform flat monocrystalline Si having extremely high crystallinity over a large area by employing two-step selective etching in which the selectivity in the second etching step is remarkably high.

The oxidation of the internal wall of the pores of porous Si is known to be effective in inhibiting structural change of the porous Si during heat treatment. Further effects are achieved in the present invention in (1) improvement of the selectivity at the first etching step, and (2) acceleration of etching of porous Si in the second etching step to give a high selectivity. In the selective etching of bulk Si at the first etching step, since the internal surface of the porous Si is covered with an oxide film, the porous Si layer serves as a satisfactory etch-stop layer by use of an etching solution exhibiting a higher etching velocity to Si than to $SiO_2$.

In the first etching step, the exposed porous Si region which comes to be exposed earlier owing to non-uniformity of the porous Si thickness and irregularity of etching of the first etching step will become thin before the completion of etching of the bulk Si in other region. However, the extraordinary high selectivity in the second etching step compensates the nonuniformity of the thickness of the remaining porous Si.

What is claimed is:

1. A process for producing a semiconductor device substrate, comprising the steps of making a first substrate member porous, forming an insulating layer on a second substrate member, forming an amorphous layer on the insulating layer on the second substrate member, bonding the porous first substrate member to the amorphous layer at a temperature of an atmosphere in which the amorphous layer at least does not crystallize, causing solid-phase epitaxial growth of the amorphous layer by utilizing the porous first substrate member as crystal growth seed, and removing the bonded first substrate member after completion of the epitaxial growth by chemical etching.

2. A process for producing a semiconductor device substrate, comprising the steps of making a first substrate member porous, forming an amorphous layer on a second substrate member, bonding the porous first substrate member to the amorphous layer at a temperature of an atmosphere in which the amorphous layer at least does not crystallize, causing solid-phase epitaxial growth of the amorphous layer by utilizing the porous first substrate member as crystal growth seed, and removing the bonded first substrate member after completion of the epitaxial growth by chemical etching.

3. A process for producing a semiconductor device substrate according to claim 1, wherein at least one of the first substrate member and the amorphous layer is composed of a simple element or a compound semiconductor.

4. A process for producing a semiconductor device substrate, comprising the steps of making porous a surface layer of at least one side of a first substrate member composed of Si, forming an insulating layer on a second substrate member, forming amorphous Si on the insulating layer, bonding the surface of the amorphous Si to the surface of the porous surface layer at a temperature in which the amorphous Si at least does not crystallize, causing solid-phase spitaxial growth of the amorphous Si by utilizing the porous first substrate member as crystal growth seed, removing the first substrate member by grinding or polishing to an extent that the porous portion is just unexposed or a part thereof is exposed, removing the remaining portion of the first substrate member except the porous portion by selective etching as a first-removal step, and removing the porous portion by selective chemical etching as a second removal step.

5. A process for producing a semiconductor device substrate, comprising the steps of making porous a surface layer of at least one side of a first substrate member composed of Si, forming amorphous Si on a second substrate member, bonding the surface of the amorphous Si to the surface of the porous surface layer at a temperature in which the amorphous Si at least does not crystallize, causing solid-phase epitaxial growth of the amorphous Si by utilizing the porous first substrate member as crystal growth seed, removing the first substrate member by grinding or polishing to an extent that the porous portion is just unexposed or a part thereof is exposed, removing the remaining first substrate member except the porous portion by selective etching as a first removal step, and removing the porous portion by selective chemical etching as a second removal step.

6. A process for producing a semiconductor device substrate, comprising the steps of making porous a surface layer of at least one side of a first substrate member composed of Si, forming an insulating layer on a second substrate member, forming amorphous Si on the insulating layer, bonding the surface of the amorphous Si to the surface of the porous surface layer at a temperature in which the amorphous layer at least does not crystallize, causing solid-phase epitaxial growth of the amorphous Si by utilizing the porous first substrate member as crystal growth seed, removing the remaining first substrate member except the porous portion by selective etching as a first removal step, and removing the porous portion by selective chemical etching as a second removal step.

7. A process for producing a semiconductor device substrate, comprising the steps of making porous a surface layer of at least one side of a first substrate member composed of Si, forming amorphous Si on a second substrate member, bonding the surface of the amorphous Si to the surface of the porous surface layer at a temperature in which the amorphous layer at least does not crystallize, causing solid-phase epitaxial growth of the amorphous Si by utilizing the porous first substrate member as crystal growth seed, removing the first substrate member except the porous portion by selective etching as a first removal step, and removing the porous portion by selective chemical etching as a second removal step.

8. A process for producing a semiconductor device substrate according to any one of claims 1, 4 and 6, wherein the insulating layer is one of a thermal oxidation film, a deposited $SiO_2$ film, a deposited $Si_3N_4$ film and a multi-layered film thereof.

9. A process for producing a semiconductor device substrate according to any one of claims 3 to 7, wherein the amorphous layer is formed by vapor phase growth.

10. A process for producing a semiconductor device substrate according to any one of claims 3 to 7, wherein the amorphous layer is formed by formation of polycrystalline Si by vapor phase growth, and subsequent ion implantation to make the polycrystalline Si amorphous.

11. A process for producing a semiconductor device substrate according to any one of claims 3 to 7, wherein the amorphous layer is formed by formation of amorphous Si by vapor phase growth, and subsequent ion implantation into the amorphous Si.

12. A process for producing a semiconductor device substrate according to any one of claims 1 to 7, wherein the step of making porous the first substrate member is anodization.

13. A process for producing a semiconductor device substrate according to claim 12, wherein the anodization is conducted in an HF solution.

14. A process for producing a semiconductor device substrate according to claim 1 or 2, wherein the chemical etching of the porous portion is conducted, after the step of bonding the first substrate member and the second substrate member, by immersing both the bonded substrate members in buffered hydrofluoric acid, or a mixture of buffered hydrofluoric acid with at least one of an alcohol and a hydrogen peroxide solution, and thereby removing selectively only the porous portion.

15. A process for producing a semiconductor device substrate according to any one of claims 4, 5, 6 and 7, wherein the chemical etching of the porous portion is conducted by immersing the first substrate member and the second substrate member bonded together, after the selective etching as the first removal step, in buffered hydrofluoric acid or a mixture of buffered hydrofluoric acid with at least one of an alcohol and a hydrogen peroxide solution, and thereby removing selectively only the porous portion of the first substrate member.

16. A process for producing a semiconductor device substrate according to claim 1 or 2, wherein the chemical etching of the porous portion is conducted, after the step of bonding the first substrate member and the second substrate member, by immersing both the bonded substrate members in hydrofluoric acid, or a mixture of hydrofluoric acid with at least one of an alcohol and a hydrogen peroxide solution, and thereby removing selectively only the porous portion of the first substrate member.

17. A process for producing a semiconductor device substrate according to any one of claims 4, 5, 6 and 7, wherein the chemical etching of the porous portion is conducted by immersing the first substrate member and the second substrate member bonded together, after the selective etching as the first removal step, in hydrofluoric acid or a mixture of hydrofluoric acid with at least one of an alcohol and a hydrogen peroxide solution, and thereby removing selectively only the porous portion of the first substrate member.

18. A process for producing a semiconductor device substrate according to any one of claims 1 to 7, wherein the second substrate member is composed of Si.

19. A process for producing a semiconductor device substrate according to any one of claims 1 to 7, wherein the second substrate member is composed of a material different from Si.

20. A process for producing a semiconductor device substrate according to any one of claims 1 to 7, wherein the second substrate member is composed of a light-transmissive material.

21. A process for producing a semiconductor device substrate, comprising the steps of making porous a surface layer of at least one side of a first substrate member, forming an amorphous layer on a second substrate member composed of a material different from the first substrate member, bonding the surface of the amorphous layer to the surface of the porous layer at a temperature in which the amorphous layer does not crystallize, thinning the first substrate member by removing a part thereof, causing solid-phase epitaxial growth of the amorphous layer by utilizing the porous layer as crystal growth seed, removing the rest of the first substrate member selectively as a first removal step, and selectively removing only the remaining porous layer of the bonded substrate members as a second removal step.

22. A process for producing a semiconductor device substrate according to claim 21, wherein at least one of the first substrate member and the amorphous layer is composed of a simple element or a compound semiconductor.

23. A process for producing a semiconductor device substrate, comprising the steps of making porous a surface layer of at least one side of a first substrate member composed of Si, oxidizing a part of pores in the Si layer made porous, forming amorphous Si on a second substrate member composed of a material different from Si, bonding the surface of the amorphous Si to the surface of the porous Si at a temperature in which the amorphous Si does not crystallize, removing the first substrate member composed of Si by grinding or polishing to an extent that the porous Si layer is just unexposed or a part thereof is exposed, causing solid-phase epitaxial growth of the amorphous Si by utilizing the porous Si as crystal growth seed, removing the rest of the first Si substrate member by selective etching as a first etching step, and removing only the remaining porous Si of the bonded substrate members after the grinding and the etching by selective chemical etching as a second etching step.

24. A process for producing a semiconductor device substrate, comprising the steps of making porous a surface layer of at least one side of a first Si substrate member composed of Si, oxidizing a part of pores in the Si layer made porous, forming an insulating layer on a second substrate member composed of a material different from Si, forming amorphous Si on the insulating layer, bonding the surface of the amorphous Si to the surface of the porous Si at a temperature in which the amorphous Si does not crystallize, removing the first Si substrate member by grinding or polishing to an extent that the porous Si layer is just unexposed or a part thereof is exposed, causing solid-phase epitaxial growth of the amorphous Si by utilizing the porous Si as crystal growth seed, removing the rest of the first substrate member composed of Si by selective etching as a first etching step, and removing the remaining porous Si only of the bonded substrate members after the grinding and the etching by selective chemical etching as a second etching step.

25. A process for producing a semiconductor device substrate, comprising the steps of making porous a surface layer of at least one side of a first substrate member composed of Si, oxidizing a part of pores in the Si layer made porous, forming amorphous Si on a second substrate member composed of a material different from Si, bonding the surface of the amorphous Si to the surface of the porous Si at a temperature in which the amorphous Si does not crystallize, removing the first Si substrate member by grinding or polishing to an extent that the porous Si layer is just unexposed or a part thereof is exposed, removing the rest of the first Si substrate member by selective etching as a first etching step, causing solid-phase epitaxial growth of the amorphous Si by utilizing the porous Si as crystal growth seed, and removing only the porous Si of the bonded substrates after the grinding and the etching by selective chemical etching as a second etching step.

26. A process for producing a semiconductor device substrate, comprising the steps of making porous a surface layer of at least one side of a first Si substrate member composed of Si, oxidizing a part of pores in the Si layer made porous, forming an insulating layer on a second substrate member composed of a material different from Si, forming amorphous Si on the insulating layer, bonding the surface of the amorphous Si to the surface of the porous Si at a temperature in which the amorphous Si does not crystallize, removing the first Si substrate member by grinding or polishing to an extent that the porous Si layer is just unexposed or a part thereof is exposed, removing the rest of the first Si substrate member by selective etching as a first etching step, causing solid-phase epitaxial growth of the amorphous Si by utilizing the porous Si as crystal growth seed, and removing only the remaining porous Si of the bonded substrate members after the grinding and the etching by selective chemical etching as a second etching step.

27. A process for producing a semiconductor device substrate, comprising the steps of making porous a surface layer of at least one side of a first Si substrate member composed of Si, oxidizing a part of pores in the Si layer made porous, forming amorphous Si on a second substrate member composed of a material different from Si, bonding the surface of the amorphous Si to the surface of the porous Si at a temperature in which the amorphous Si does not crystallize, causing solid-phase epitaxial growth of the amorphous Si by utilizing the porous Si as crystal growth seed, removing the first Si substrate member by selective etching as a first etching step, and removing the porous Si only of the bonded and etched substrate members by selective chemical etching as a second etching step.

28. A process for producing a semiconductor device substrate, comprising the steps of making porous a surface layer of at least one side of a first Si substrate member composed of Si, oxidizing a part of pores in the Si layer made porous, forming an insulating layer on a second substrate member composed of a material different from Si, forming amorphous Si on the insulating layer, bonding the surface of the amorphous Si to the surface of the porous Si at a temperature in which the amorphous Si does not crystallize, causing solid-phase epitaxial growth of the amorphous Si by utilizing the porous Si as crystal growth seed, removing the first Si substrate member by selective etching as a first etching step, and removing only the remaining porous Si of the bonded and etched substrate members by selective chemical etching as a second etching step.

29. A process for producing a semiconductor device substrate, comprising the steps of making porous a surface layer of at least one side of a first Si substrate member composed of Si, oxidizing a part of pores in the Si layer made porous, forming amorphous Si on a second substrate member composed of a material different from Si, bonding the surface of the amorphous Si to the surface of the porous Si at a temperature in which the amorphous Si does not crystallize, removing the first Si substrate member by selective etching as a first etching step, causing solid-phase epitaxial growth of the amorphous Si by utilizing the porous Si as crystal growth seed, and removing only the porous Si of the bonded and etched substrate members by selective chemical etching as a second etching step.

30. A process for producing a semiconductor device substrate, comprising the steps of making porous a surface layer of at least one side of a first Si substrate member composed of Si, oxidizing a part of pores in the Si layer made porous, forming an insulating layer on a second substrate member composed of a material different from Si, forming amorphous Si on the insulating layer, bonding the surface of the amorphous Si to the surface of the porous Si at a temperature in which the amorphous Si does not crystallize, removing the first Si substrate member by selective etching as a first etching step, causing solid-phase epitaxial growth of the amorphous Si by utilizing the porous Si as crystal growth seed, and removing only the remaining porous Si of the bonded and etched substrate members by selective chemical as a second etching step.

31. A process for producing a semiconductor device substrate according to any one of claims 23–30, wherein the step of oxidizing the porous Si layer is conducted by any one of thermal oxidation, spontaneous oxidation in the air, and oxidation during washing step of RCA, or combination thereof.

32. A process for producing a semiconductor device substrate according to any one of claims 21 to 30, wherein the step of removing the porous Si is conducted by immersing the bonded substrate members in hydrofluoric acid, or a mixture of hydrofluoric acid with at least one of an alcohol and a hydrogen peroxide solution.

33. A process for producing a semiconductor device substrate according to any one of claims 21 to 30, wherein the step of removing the porous Si is conducted by immersing the bonded substrate members in buffered hydrofluoric acid, or a mixture of buffered hydrofluoric acid with at least one of an alcohol and a hydrogen peroxide solution.

34. A process for producing a semiconductor device substrate according to any one of claims 24, 26, 28 and 30, wherein the insulating layer is one of a thermal oxidation film, a deposited $SiO_2$ film, a deposited $Si_3N_4$ film, or a multi-layered film thereof.

35. A process for producing a semiconductor device substrate according to any one of claims 22 to 30, wherein the amorphous layer is formed by vapor phase growth.

36. A process for producing a semiconductor device substrate according to any one of claims 22 to 30, wherein the amorphous layer is formed by formation of polycrystalline Si by vapor phase growth and subsequent ion implantation to make the polycrystalline Si amorphous.

37. A process for producing a semiconductor device substrate according to any one of claims 22 to 30, wherein the amorphous layer is formed by formation of amorphous Si by vapor phase growth and subsequent ion implantation into the amorphous Si.

38. A process for producing a semiconductor device substrate according to any one of claims 21 to 30, wherein the step of making porous the first substrate member is anodization.

39. A process for producing a semiconductor device substrate according to claim 38, wherein the anodization is conducted in an HF solution.

40. A process for producing a semiconductor device substrate according any one of claims 21 to 30, wherein the second substrate member is made of a light-transmissive material.

41. A process for producing a semiconductor device substrate, comprising the steps of:

providing a first substrate member having a porous layer on a surface thereof;

providing a second substrate member having an amorphous layer on a surface thereof;

bonding the porous layer to the amorphous layer at a temperature of an atmosphere in which the amorphous layer at least does not crystallize;

causing solid-phase epitaxial growth of the amorphous layer by utilizing the porous layer as a crystal growth seed; and removing the porous layer after the epitaxial growth of the amorphous layer by chemical etching.

42. A process for producing a semiconductor device substrate, comprising the steps of:

providing a first substrate member having a porous layer on a surface thereof;

oxidizing a part of pores in the porous layer;

providing a second substrate member having an amorphous layer on a surface thereof;

bonding the oxidized porous layer to the amorphous layer at a temperature of an atmosphere in which the amorphous layer at least does not crystallize;

causing solid-phase epitaxial growth of the amorphous layer by utilizing the oxidized porous layer as a crystal growth seed; and removing said oxidized porous layer after the epitaxial growth of the amorphous layer by chemical etching.

43. The process according to claim 41 or claim 42, wherein the porous layer comprises silicon.

44. The process according to claim 41 or claim 42, wherein the amorphous layer comprises silicon.

45. The process according to claim 41 or claim 42, wherein the second substrate comprises an insulator.

* * * * *

UNITED STATES PATENT AND TRADEMARK OFFICE
CERTIFICATE OF CORRECTION

PATENT NO. : 5,492,859

DATED : February 20, 1996

INVENTORS : Kiyofumi Sakaguchi et al.  Page 1 of 4

It is certified that error appears in the above-identified patent and that said Letters Patent is hereby corrected as shown below:

ON THE TITLE PAGE

"[76] Inventors: etc." should read --[75] Inventors: Kiyofumi Sakaguchi; Takao Yonehara, both of Atsugi; Shoji Nishida, Fujisawa, all of Japan--.

[73]  Insert --[73] Assignee: Canon Kabushiki Kaisha, Tokyo, Japan--.

COLUMN 1

Line 57,  "an" should read --a--;
Line 60,  "an" should read --a--.

COLUMN 2

Line 66,  "substrated" should read --substrate--.

COLUMN 3

Line 15,  "removed" should read --be removed--;
Line 21,  "41th" should read --41st--;
Line 28,  "has" should read --have--;

UNITED STATES PATENT AND TRADEMARK OFFICE
CERTIFICATE OF CORRECTION

PATENT NO. : 5,492,859

DATED : February 20, 1996

INVENTORS : Kiyofumi Sakaguchi et al.

It is certified that error appears in the above-identified patent and that said Letters Patent is hereby corrected as shown below:

COLUMN 3

Line 32, "si" should read --Si--;
   Line 48, "disorderness" should read --disorderliness--;
   Line 62, "have" should read --has--.

COLUMN 4

Line 17, "micron" should read --microns--;
   Line 39, "water" should read --Water--;
   Line 54, "less" should read --fewer--.

COLUMN 6

Line 25, "is" should read --are--.

COLUMN 8

Line 10, "have" should read --has--;
   Line 40, "need" should read --needs--.

COLUMN 13

Line 35, "circles (o)." should read --circles (●).--.

UNITED STATES PATENT AND TRADEMARK OFFICE
CERTIFICATE OF CORRECTION

PATENT NO. : 5,492,859

DATED : February 20, 1996

INVENTORS : Kiyofumi Sakaguchi et al.

It is certified that error appears in the above-identified patent and that said Letters Patent is hereby corrected as shown below:

COLUMN 26

Line 62,   "microscopy" should read --microscopy.

Example 30--.

COLUMN 28

Line 39,   "49 hydrof-" should read --49% hydrof--.

COLUMN 33

Line 10,   "The all" should read --All--.

UNITED STATES PATENT AND TRADEMARK OFFICE
CERTIFICATE OF CORRECTION

PATENT NO. : 5,492,859

DATED : February 20, 1996

INVENTORS : Kiyofumi Sakaguchi et al.

Page 4 of 4

It is certified that error appears in the above-identified patent and that said Letters Patent is hereby corrected as shown below:

COLUMN 34

Line 13, "The all" should read --All--.

COLUMN 41

Line 7, "The all" should read --All--.

Signed and Sealed this

Tenth Day of September, 1996

Attest:

BRUCE LEHMAN

Attesting Officer    Commissioner of Patents and Trademarks